United States Patent
Kitano et al.

(10) Patent No.: US 8,916,335 B2
(45) Date of Patent: Dec. 23, 2014

(54) PHOTO-CURABLE TRANSFER SHEET, PROCESS FOR THE PREPARATION OF OPTICAL INFORMATION RECORDING MEDIUM USING THE SHEET, AND OPTICAL INFORMATION RECORDING MEDIUM

(75) Inventors: Hideki Kitano, Kodaira (JP); Takato Inamiya, Kodaira (JP); Kenji Murayama, Kodaira (JP); Hidefumi Kotsubo, Kodaira (JP); Yasuhiro Morimura, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 2629 days.

(21) Appl. No.: 10/574,840

(22) PCT Filed: Oct. 6, 2004

(86) PCT No.: PCT/JP2004/015091
§ 371 (c)(1),
(2), (4) Date: Jan. 19, 2007

(87) PCT Pub. No.: WO2005/035635
PCT Pub. Date: Apr. 21, 2005

(65) Prior Publication Data
US 2007/0218374 A1    Sep. 20, 2007

(30) Foreign Application Priority Data

| Oct. 7, 2003 | (JP) | 2003-348360 |
| Oct. 7, 2003 | (JP) | 2003-348373 |
| Oct. 30, 2003 | (JP) | 2003-370779 |
| Nov. 26, 2003 | (JP) | 2003-395799 |
| Dec. 24, 2003 | (JP) | 2003-426140 |
| Dec. 24, 2003 | (JP) | 2003-426163 |
| Dec. 24, 2003 | (JP) | 2003-426599 |
| Oct. 4, 2004 | (JP) | 2004-291166 |

(51) Int. Cl.
*G03F 7/035* (2006.01)
*G11B 7/252* (2006.01)
(Continued)

(52) U.S. Cl.
CPC ............. *G11B 7/263* (2013.01); *G03F 7/0388* (2013.01); *C08G 18/702* (2013.01); *G11B 7/2542* (2013.01); *G03F 7/035* (2013.01); *B29D 17/005* (2013.01); *B29C 2035/0827* (2013.01); *C08G 18/728* (2013.01); *G11B 7/252* (2013.01); *G11B 7/24038* (2013.01); *G11B 7/256* (2013.01)
USPC ................. 430/287.1; 430/284.1; 430/286.1; 430/320; 264/1.33; 264/1.36; 264/1.38

(58) Field of Classification Search
None
See application file for complete search history.

(56) References Cited

U.S. PATENT DOCUMENTS

| 6,586,496 B1 * | 7/2003 | Takamatsu et al. ............ 522/168 |
| 2003/0129385 A1 * | 7/2003 | Hojo et al. ..................... 428/323 |
| 2004/0257972 A1 * | 12/2004 | Kitano et al. ............... 369/275.5 |

FOREIGN PATENT DOCUMENTS

| JP | 2002-256228 A | 9/2002 |
| JP | 2003-082043 A | 3/2003 |

(Continued)

*Primary Examiner* — Martin Angebranndt
(74) *Attorney, Agent, or Firm* — Sughrue Mion, PLLC

(57) ABSTRACT

A photo-curable transfer sheet having a photo-curable transfer layer comprising a photo-curable composition, the photo-curable composition being deformable by application of pressure and containing a reactive polymer having a photopolymerizable functional group,
wherein the photo-curable transfer layer shows linearity in relationship between strain [γ] (%) and time [t] (second) measured by a creep test using a dynamic viscoelasticity measuring apparatus under the conditions of an ordinary temperature, stress of 50 Pa and a time period of 120 seconds, and satisfies a following formula: log γ=a+b·log t, in which "a" is a real number, and "b" is in the range of 0.10 to 0.53; and a process for the preparation of an optical information recording medium using the sheet and an optical information recording medium.

21 Claims, 8 Drawing Sheets

(51) Int. Cl.
  *G11B 7/26* (2006.01)
  *C08G 18/70* (2006.01)
  *G11B 7/2542* (2013.01)
  *C08G 18/72* (2006.01)
  *G11B 7/256* (2006.01)
  *G03F 7/038* (2006.01)
  *B29D 17/00* (2006.01)
  *B29C 35/08* (2006.01)
  *G11B 7/24038* (2013.01)

(56) References Cited

FOREIGN PATENT DOCUMENTS

| | | |
|---|---|---|
| JP | 2003-123332 A | 4/2003 |
| JP | 2003-200698 A | 7/2003 |
| JP | 2003-263802 A | 9/2003 |
| JP | 2003-272260 A | 9/2003 |
| WO | 03/032305 A1 | 4/2003 |
| WO | WO-03-032305 * | 4/2003 |
| WO | WO 03/032305 A1 | 4/2003 |

* cited by examiner

PHOTO-CURABLE TRANSFER SHEET, PROCESS FOR THE PREPARATION OF OPTICAL INFORMATION RECORDING MEDIUM USING THE SHEET, AND OPTICAL INFORMATION RECORDING MEDIUM

BACKGROUND OF INVENTION

1. Field of the Invention

The present invention relates to an optical information recording medium, such as DVD (Digital Versatile Disc) or CD (Compact Disc), in which a large amount of information such as letters, sound and animation is recorded and/or recordable as digital signals, a process for the preparation thereof, and further a photo-curable transfer sheet advantageously utilized in the medium and process.

2. Description of the Related Art

As an optical information recording medium in which digital signals are in advance recorded by forming pits on its surface, CD and CD-ROM are widely used. Recently, DVD that the animation can be also recorded by forming pits on its both (double) sides has been noted as the next generation recording medium instead of CD and increasingly used. Further, attention is directed to recordable discs such as CD-R, DVD-R and DVD-RW having groove(s) or grooves and pits thereon.

Conventional DVD having recording layers (surfaces) on its both sides includes a disc readable from double sides, as shown in FIG. 9, in which each of reflective layers 1a, 2a is formed on a signal-pits surface of each of transparent resin substrates 1, 2 having the signal-pits surface on its one side, and the two transparent resin substrates 1, 2 are bonded to each other through an adhesive layer 3 such that the reflective layers 1a, 2a are faced to each other; and a disc readable from single side, as shown in FIG. 10, in which a semitransparent reflective layer 1b is formed on a signal-pits surface of a transparent resin substrate 1 while a reflective layer 2a is formed on a signal-pits surface of another transparent resin substrate 2 and the two transparent resin substrates 1, 2 are bonded to each other through an adhesive layer 3 such that the semitransparent reflective layers 1b and the reflective layer 2a are faced to each other.

The DVD readable from double sides can be prepared, for example, by subjecting melted polycarbonate resin to injection molding by the use of a stamper having unevenness (concave and convex) corresponding to the reverse of unevenness of the signal-pits to be recorded on the substrate to prepare a transparent resin substrate having unevenness on its surface, forming a reflective layer on the uneven surface by spattering metal such as aluminum on it, and bonding two transparent resin substrates obtained in the above manner to each other through an adhesive such that the two reflective layers are faced to each other.

For example, a standardized specification of a next generation optical disc "Blu-Ray Disc" was proposed on Feb. 10, 2002. The specification mainly includes storage capacity of 23.3/25/27GB, laser wavelength of 405 nm (violaceous laser), lens numerical aperture (N/A) of 0.85, disc diameter of 120 mm, disc thickness of 1.2 mm and track pitch of 0.32 µm.

In the Blu-Ray Disc, as mentioned above, the sizes of groove and pits are reduced, and therefore it is required to reduce a spot size of a reading laser. The reduction of the spot size results in that the reading is apt to be influenced by inclination of the disc, and hence even DVD having a little warpage cannot be reproduced (read out). In order to avoid the disadvantage, it may be effective to reduce a thickness of a substrate and make a thickness of a cover layer provided on pits surface on a laser-irradiation side to approx. 0.1 mm.

"NIKKEI ELECTRONICS", Nov. 5, 2001, pp.68 describes a process for the preparation of DVD suited to the above-mentioned requirements. The process is explained by referring to FIG. 11. A UV curable resin 5A is provided, by application, on a reflective layer (or recording layer) 6a of a disc substrate (1.1 mm) 4a having the reflective layer on its uneven surface, while a UV curable resin 5B is provided, by application, on a stamper 4b made of polycarbonate having uneven surface. Subsequently, after the substrate is turned over, the turned-over substrate and the stamper are put together, and the UV curable resins 5A, 5B are cured by irradiating ultraviolet beam from the stamper side. The stamper 4b is then removed from the cured UV curable resin 5B, a reflective layer (or recording layer) 6b is formed on the uneven surface and further a cover layer (thickness of approx. 0.1 mm) 7 is provided the reflective layer 6b.

In the process described in NIKKEI ELECTRONICS, a UV curable resin (layer) is provided on a disc substrate and a stamper by application, and the substrate is turned over and bonded to the stamper. Hence, the process is needed to perform complicated procedures such as the application and turning over steps. In more detail, when the turned-over substrate and the stamper are put together through viscous UV curable resins, bubbles are generated in the vicinity of an interface of the combined UV curable resins. Hence it is difficult to successfully bond the UV curable resins of the substrate and stamper to each other. Furthermore, the UV curable resin is accompanied by large shrinkage on its curing, and hence the resultant medium is apt to have deformation such as warpage.

A process for the preparation of an optical information recording medium such as DVD capable of solving the above disadvantages is disclosed in WO 03/032305 A1. In the process, used is a photo-curable transfer sheet having a photo-curable transfer layer comprising a photo-curable composition, the photo-curable composition being deformable by application of pressure and containing a reactive polymer having a photopolymerizable functional group. In more detail, the photo-curable transfer sheet in the form of solid instead of the above UV curable resin is used when depression of the stamper, and therefore it is possible to transfer the uneven surface into the sheet to avoid the above disadvantages.

SUMMARY OF THE INVENTION

The photo-curable transfer sheet enables the transfer of the uneven surface of the substrate or stamper even at an ordinary temperature. Therefore, when the transfer sheet is prepared or stored in the form of roll, the components constituting the photo-curable transfer layer of the sheet are apt to bleed from the roll. In more detail, though the photo-curable transfer sheet generally has a structure consisting of the photo-curable transfer layer having softening tendency and a release sheet on both sides thereof, in case a continuous sheet consisting of the photo-curable transfer layer and release sheets having the same width as each other (referred as to "full edge") is wound to prepare a roll, the components of the photo-curable transfer layer of the sheet are apt to bleed from the sides of the roll to contaminate the manufacturing equipment or the workers whereby the workability tends to be reduced. Further, the roll of continuous sheet is apt to vary in the thickness during its storage.

In order to avoid the above disadvantages, it is considered that a continuous sheet consisting of the photo-curable transfer layer and the release sheets having larger width than the transfer layer (referred as to "dry edge") is used in the form of roll to conduct operations. However, the use of such continuous sheet brings about slight improvement of the workability but does not repress the variation (fluctuation) of the sheet thickness.

In view of the above-mentioned problems, a first aspect of the present invention is to provide a photo-curable transfer sheet by which an optical information recording medium (e.g., DVD) having small thickness and high capacity can be advantageously prepared in high workability.

Further the first aspect of the present invention is to provide a photo-curable transfer sheet by which an optical information recording medium (e.g., DVD) having small thickness and high capacity can be advantageously prepared, and which does not bleed the components of the sheet when the sheet is used in the form of continuous length and roll.

Furthermore, the first aspect of the present invention is to provide a process for the preparation of an optical information recording medium using the above-mentioned photo-curable transfer sheet.

Still, the first aspect of the present invention is to provide the optical information recording medium obtainable by the above-mentioned process.

In a bonded type of optical information recording medium (optical disc) such as DVD, which is used in current, aluminum is generally used for a high (reflectivity) reflective layer and gold is generally used for a semi-reflective layer. The semi-reflective layer is required to have the property that a laser beam transmits through itself and therefore to render its thickness small. Hence, gold has been used as material of the semi-reflective layer. However, since gold is highly expensive, silicon compounds or silver compounds are gradually used.

On the other hand, a blue laser used in the Blu-Ray Disc mentioned above has been further studied to enhance a storage capacity of an optical disc. A long wavelength laser such as a red laser (wavelength: CD=780 nm, DVD=635 nm) can fully transmit through the semi-reflective layer which is formed from any of gold, silicon compounds or silver compounds. However, in consideration of the transparent of a low wavelength (about 400 nm) beam of the blue laser, it has been confirmed that only silver, silver alloys or silver compounds can be used as material of the semi-reflective layer. However, the silver compounds are subject to corrosion compared with gold compounds, and therefore the resultant reflective layer generally lies in unstable condition. A bonded optical disc having the semi-reflective layer of the silver compound is inferior in durability to the conventional bonded disc using the semi-reflective layer of gold compound. No adhesives for the bonding are known so far.

In order to solve the problem, JA2002-146241 disclose that a resin composition containing the specific thiol compounds is used as a UV curable resin composition for forming a cured layer in contact with a thin layer of silver or its alloy. It further describes that the use of the specific thiol compounds prevents the corrosion and brings about an optical disc having excellent durability.

In the above-mentioned optical disc, it is required to use the specific thiol compound as an antioxidant in the amount of about 1% by weight. Though the use of the specific thiol compounds brings about slight improvement of corrosion, the cured protective layer containing the thiol compound formed on the silver reflective layer has unsatisfactory strength not to give sufficient durability to the optical disc. Thus, the addition of the thiol compound to the UV curable resin composition comprising conventional UV curable oligomer, acrylate monomer and photopolymerization initiator tends to bring about insufficient durability.

On the reflective or semi-reflective layer, a film of a photo curable resin composition is generally formed in order to bond the layer to the other layer or protect the layer. The film of photo curable resin composition generally contains phosphoric acid methacrylate in the amount of not less than 1000 ppm based on the composition to enhance bonding strength to the layer comprising a silver alloy or the like. Such technology is described in, for example JA2002-256228. In case the film for bonding or protection does not contain the phosphoric acid methacrylate, the film comes to have insufficient bonding strength and therefore is apt to be peel off the layer comprising a silver alloy or the like when a stamper is removed from the film in the process for the preparation of the optical disc, and hence it is difficult to prepare the optical disc.

Further the film (bonding film or protective film) of the composition containing phosphoric acid methacrylate is liable to yellow in an atmosphere of high humidity and temperature due to the presence of the phosphor. The film lowers in reflectivity owing to the yellowing to reduce the durability of the optical disc.

The semi-reflective layer, which is used for prepare a multi-layered optical disc, is required to be an extremely thin film and therefore suffers greatly from the yellowing.

In view of the above-mentioned problems, a second aspect of the present invention is to provide an optical information recording medium provided with a silver or silver alloy reflective layer having excellent durability.

Further the second aspect of the present invention is to provide a photo-curable composition by which the above-mentioned optical information recording medium can be advantageously prepared.

Furthermore the second aspect of the present invention is to provide a photo-curable transfer sheet by which the above-mentioned optical information recording medium can be advantageously prepared.

Still, the first aspect of the present invention is to provide a process for the preparation of the above-mentioned optical information recording medium.

The present invention can be provided by a photo-curable transfer sheet (1) having a photo-curable transfer layer comprising a photo-curable composition, the photo-curable composition being deformable by application of pressure and containing a reactive polymer having a photopolymerizable functional group, wherein the photo-curable transfer layer shows linearity in relationship between strain [γ] (%) and time [t] (second) determined by a creep test using a dynamic viscoelasticity measuring apparatus under the conditions of an ordinary temperature, stress of 50 Pa and a time period of 120 seconds, and satisfies a following formula:

$$\log \gamma = a + b \cdot \log t$$

in which "a" is a real number, and "b" is in the range of 0.05 to 0.55 (especially 0.1 to 0.53). The use of the photo-curable transfer sheet (1) can attain the first aspect.

In the photo-curable transfer sheet (1), it is preferred that the reactive polymer has a glass transition temperature of not more than 20° C. (especially 15 to −10° C.), the reactive polymer has number average molecular weight of 10,000 to 300,000, and the reactive polymer has weight average molecular weight of 10,000 to 300,000. Thereby the excellent transfer properties and workability can be easily obtained.

The reactive polymer preferably has 1 to 50% by mole of the photopolymerizable functional group to obtain an appropriate curing rate and cured film strength. Moreover, the photopolymerizable functional group is a (meth)acryloyl group to obtain an appropriate curing rate. The photo-curable composition generally contains 0.1 to 10% by weight of a photopolymerization initiator to obtain an appropriate curing rate. The photo-curable transfer sheet preferably has a thickness of 1 to 1,200 μm, especially 5 to 300 μm in terms of transfer properties and workability.

The photo-curable transfer sheet generally has a light transmittance of not less than 70% in a wavelength rang of 380 to 420 nm, preferably in a wavelength rang of 380 to 600 nm, especially in a wavelength range of 380 to 800 nm. An optical disc obtained by using the transfer sheet having the light transmittance ensures that the disc operates without error if the disc is read out by irradiation of laser. Moreover, the photo-curable transfer sheet generally has cure shrinkage of not more than 8%.

The above-mentioned preferred embodiments of the transfer sheet (1) can be also applied to the following photo-curable transfer sheets (2) to (8).

The reactive polymer of the transfer sheet (1) preferably has a functional group having active hydrogen and the photpolymerizable functional group, and the photo-curable composition preferably contains a compound having at least two groups reactive to the functional group having active hydrogen. Such transfer sheet containing the functional groups is slightly crosslinked by the reaction with the compound having at least two groups reactive to the functional group having active hydrogen (generally the reaction for 24 hours at ordinary temperature after the application), whereby the transfer layer is effectively prevented from its bleeding (exudation) or variation of the thickness. The functional group having active hydrogen of the reactive polymer of the transfer sheet (1) generally is a hydroxyl group. The groups reactive to the functional group having active hydrogen preferably are isocyanate groups. The isocyanate groups are capable of curing with the hydroxyl group or the like at ordinary temperature, to show good workability. The photo-curable composition preferably contains the a compound having at least two groups reactive to the functional group having active hydrogen in the amount of 0.2 to 2% by weight, which results in an appropriate crosslinking to prevent the bleeding of the transfer layer. In this case, the transfer properties of the uneven surface of the substrate or stamper are also maintained in good level. The reactive polymer preferably has 0.1 to 10% by mole of the functional group having active hydrogen, whereby an appropriate crosslinking to prevent the bleeding of the transfer layer can be obtained.

In the reactive polymer of the transfer sheet (1), the photo-curable composition preferably further contains a tackifier having solubility parameter (SP value) of not less than 8.50. The photo-curable composition preferably further contains a transparent fine particle having mean particle size of not more than 300 nm.

The photo-curable transfer layer (1) preferably has storage elastic moduli of $1\times10^3$ to $9\times10^4$ Pa at frequency of 1 Hz and a temperature of 25° C., of not less than $5\times10^3$ Pa at a frequency of 0.01 Hz and a temperature of 25° C., and of not more than $1\times10^7$ Pa at frequency of 100 Hz and a temperature of 25° C.

The photo-curable composition of the photo-curable transfer layer (1) preferably further contains a phenol compound having a substituent or substituents in the amount of 0.01 to 0.3% by weight based on the composition. A surface of a cured layer formed by curing the photo-curable composition preferably has a water contact angle of not less than 60 degrees. Further, the photo-curable composition contains phosphoric acid (meth)acrylate or derivatives thereof in the amount of 10 to 220 ppm based on the composition.

The present invention can be provided by:

a photo-curable transfer sheet (2) having a photo-curable transfer layer comprising a photo-curable composition, the photo-curable composition being deformable by application of pressure and containing a reactive polymer having a photopolymerizable functional group and a functional group having active hydrogen, wherein the photo-curable composition contains a compound having at least two groups reactive to the functional group having active hydrogen;

a photo-curable transfer sheet (3) having a photo-curable transfer layer comprising a photo-curable composition, the photo-curable composition being deformable by application of pressure and containing a reactive polymer having a photopolymerizable functional group, wherein the photo-curable composition further contains a tackifier having solubility parameter (SP value) of not less than 8.50;

a photo-curable transfer sheet (4) having a photo-curable transfer layer comprising a photo-curable composition, the photo-curable composition being deformable by application of pressure and containing a reactive polymer having a photopolymerizable functional group and a transparent fine particle having mean particle size of not more than 300 nm; and a photo-curable transfer sheet (5) having a photo-curable transfer layer comprising a photo-curable composition, the photo-curable composition containing a reactive polymer having a photopolymerizable functional group, wherein the photo-curable transfer layer has storage elastic moduli of $1\times10^3$ to $1\times10^4$ Pa at frequency of 1 Hz and a temperature of 25° C., of not less than $5\times10^3$ Pa at a frequency of 0.01 Hz and a temperature of 25° C., and of not more than $1\times10^7$ Pa at frequency of 100 Hz and a temperature of 25° C.

The use of the photo-curable transfer sheets (2) to (5) can attain the first aspect.

The preferred embodiments of the photo-curable transfer sheet (1) can be applied to the photo-curable transfer sheet (2).

In the photo-curable transfer sheet (3), the SP value of the tackifier preferably is not more than 9.50, especially not more than 9.00. Such tackifier is compatible with the reactive polymer and if necessary reactive diluents to give effectively (i.e., in small amount) appropriate viscosity and stickiness to the transfer layer (e.g., enhancement of the bonding strength between the transfer layer and release sheet), which results in the prevention of the bleeding of the transfer layer and of the variation of the thickness.

The tackifier preferably has a melting point of 90 to 130° C., and a glass transition point of 45 to 65° C. The number or weight average molecular weight of the tackifier preferably is in the range of 600 to 800. The tackifier preferably is a rosin derivative or terpene derivative.

In the photo-curable transfer sheet (4), the transparent fine particle is at least one selected from silica, titanium dioxide, and polymethyl methacrylate, especially silica. The photo-curable composition generally contains the transparent fine particle in the amount of 5 to 20% by weight. The mean particle size of the transparent fine particle preferably is in the range of 1 to 300 nm, especially 1 to 200 nm. In these preferred embodiments, it is possible that the high transparency of the layer is advantageously maintained with depressing the bleeding and the variation of thickness of the sheet.

In the photo-curable transfer sheet (5), the photo-curable composition preferably further contain a plasticizing reactive diluent having a photopolymerizable functional group and a molecular weight of not more than 1000. The photo-curable composition preferably contain the plasticizing reactive diluent in the amount of not less than 10% by weight (in solid), further preferably not less than 20% by weight, especially not less than 25% by weight based on the composition (in solid), and the upper limit preferably is 40% by weight. The plasticizing reactive diluent having a photopolymerizable functional group generally is di(meth)acrylate of alkane diol (preferably linear alkane), and the alkane diol preferably has 3 to 10 of carbon atoms. Acrylate is especially preferred.

The present invention can be also provided by the photo-curable composition described in the photo-curable transfer sheets (1) to (5).

Further the present invention is provided by:

an optical information recording medium comprising a cured layer of a photo-curable composition having an uneven surface of recorded pits and/or grooves and a reflective layer of a silver or silver alloy formed on the uneven surface, wherein the photo-curable composition is the composition as the photo-curable transfer sheets (1) to (5); and an optical information recording medium comprising an optical information recording substrate having an uneven surface of recorded pits and/or grooves, a reflective layer of a silver, silver alloy or silver compound formed on the uneven surface, and a cured layer of a photo-curable composition in close contact with the uneven surface of the reflective layer, wherein the photo-curable composition is the composition as the photo-curable transfer sheets (1) to (5).

The photo-curable transfer sheet of the invention that can preferably attain the second aspect, are as follows:

a photo-curable transfer sheet (6) having a photo-curable transfer layer comprising a photo-curable composition, the photo-curable composition containing a reactive polymer having a photopolymerizable functional group, and a phenol compound having a substituent or substituents in the amount of 0.01 to 0.3% by weight (based on the composition);

a photo-curable transfer sheet (7) having a photo-curable transfer layer containing a reactive polymer having a photopolymerizable functional group, wherein a surface of a cured layer formed by curing the photo-curable composition has a water contact angle of not less than 60 degrees; and a photo-curable transfer sheet (8) having a photo-curable transfer layer comprising a photo-curable composition, the photo-curable composition containing a reactive polymer having a photopolymerizable functional group and further containing phosphoric acid (meth)acrylate or derivatives thereof in the amount of 10 to 220 ppm (based on the composition).

In the photo-curable transfer sheet (6), the phenol compound having a substituent or substituents in the photo-curable composition generally is those used as a polymerization inhibitor or antioxidant, and especially hydroquinone or its derivative, or hindered phenol or its derivatives.

The photo-curable composition (6) preferably further acrylic resin, which enhances the durability. The acrylic resin preferably has a glass transition point (Tg) of 50 to 130° C., preferably 60 to 100° C., especially 60 to 80° C.; weight average molecular weight of 5,000 to 1,000,000, preferably 50,000 to 500,000; number average molecular weight of 5,000 to 1,000,000, preferably 50,000 to 500,000. The photo-curable composition preferably further contains the acrylic resin in the amount of 5 to 50% by weight.

Further the present invention is provided by:

an optical information recording medium (6)-1 comprising a cured layer of a photo-curable composition having an uneven surface of recorded pits and/or grooves and a reflective layer of a silver or silver alloy formed on the uneven surface, wherein the photo-curable composition is the composition of the photo-curable transfer sheet (6);

an optical information recording medium (6)-2 comprising an optical information recording substrate having an uneven surface of recorded pits and/or grooves, a reflective layer of a silver or silver alloy formed on the uneven surface, and a cured layer of a photo-curable composition in close contact with the uneven surface of the reflective layer, wherein the photo-curable composition is the composition of the photo-curable transfer sheet (6);

an optical information recording medium (6)-3 comprising an optical information recording substrate having an uneven surface of recorded pits and/or grooves, a reflective layer of a silver or silver alloy formed on the uneven surface, and a cured layer of a photo-curable composition in close contact with the uneven surface of the reflective layer, further one or more unit of the reflective layer and the cured layer being provided, wherein the photo-curable composition is the composition of the photo-curable transfer sheet (6); and an optical information recording medium (6)-4 comprising an optical information recording substrate having an uneven surface of recorded pits and/or grooves and a reflective layer of a silver or silver alloy formed on the uneven surface, and another optical information recording substrate having an uneven surface of recorded pits and/or grooves and a reflective layer of a silver or silver alloy formed on the uneven surface, the two optical information recording substrates being bonded to each other through a cured layer of a photo-curable composition such that the uneven surfaces of the reflective layers face with each other, wherein the photo-curable composition is the composition as the photo-curable transfer sheet (6).

The cured layer of the photo-curable composition preferably has a thickness of 5 to 300 μm.

In the photo-curable transfer sheet (7), the water contact angle is determined by dropping a waterdrop on the cured layer of the photo-curable composition and measuring an angle formed from a horizontal line in a solid-liquid interface and a tangent line at the waterdrop edge. The detailed procedures of the determination are carried out according to JIS R 3257.

The photo-curable composition of the photo-curable transfer sheet (7) preferably contains a reactive diluent, and examples of the reactive diluent include branched alkane or cyclic alkane having two (meth)acryloyl groups (i.e., acryloyl group or methacryloyl group), or long-chain alkane or cyclic alkane having one (meth)acryloyl group, the long-chain alkane generally having 10 or more carbon atoms. The use of such reactive diluent can easily enhance the water contact angle of the surface of cured layer.

Furthermore the present invention is provided by:

an optical information recording medium (7)-1 comprising a cured layer of a photo-curable composition having an uneven surface of recorded pits and/or grooves and a reflective layer of a silver or silver alloy formed on the uneven surface, wherein the photo-curable composition is the composition of the photo-curable transfer sheet (7) (whose cured layer has a surface of water contact angle of 60 degrees or more);

an optical information recording medium (7)-2 comprising an optical information recording substrate having an uneven surface of recorded pits and/or grooves, a reflective layer of a silver or silver alloy formed on the uneven surface, and a cured layer of a photo-curable composition in close contact with the uneven surface of the reflective layer, wherein the photo-curable composition is the composition of the photo-curable transfer sheet (7);

an optical information recording medium (7)-3 comprising an optical information recording substrate having an uneven surface of recorded pits and/or grooves, a reflective layer of a silver or silver alloy formed on the uneven surface, and a cured layer of a photo-curable composition in close contact with the uneven surface of the reflective layer, further one or more unit of the reflective layer and the cured layer being provided, wherein the photo-curable composition is the composition of the photo-curable transfer sheet (7); and an optical information recording medium (7)-4 comprising an optical information recording substrate having an uneven surface of recorded pits and/or grooves and a reflective layer of a silver or silver alloy formed on the uneven surface, and another optical information recording substrate having an uneven surface of recorded pits and/or grooves and a reflective layer of a silver or silver alloy formed on the uneven surface, the two optical information recording substrates being bonded to each other through a cured layer of a photo-curable composition such that the uneven surfaces of the reflective layers face with each other, wherein the photo-curable composition is the composition of the photo-curable transfer sheet (7).

The cured layer of the photo-curable composition preferably has a thickness of 5 to 300 μm.

In the photo-curable transfer sheet (8), the photo-curable composition contains phosphoric acid (meth)acrylate or derivatives thereof in the amount of 10 to 220 ppm as mentioned above. The use in the amount of less than 10 ppm brings about insufficient bonding strength to the reflective layer of silver alloy or the like, while the use in the amount of more than 300 ppm lowers extremely the durability. The use in the above-specified amount scarcely brings about reduction of the reflectivity of the optical disc under the conditions of high humidity and temperature, and results in sufficient bonding strength to the reflective layer. Especially the amount of 50 to 200 ppm is preferred because the two properties are preferably balanced.

As the phosphoric acid (meth)acrylate or derivatives thereof, a compound of the following formula can be preferably employed.

in which R represents H or CH$_3$, n is in the range of 0 to 2.0, a is in the range of 1.0 to 3.0, b is in the range of 0 to 2.0, and the sum of a and b is 3.0.

In the formula, preferred is a mixture of the compounds that R represents CH$_3$, a is 1.5 (mean value), b is 1.5 (mean value), and n is 0.

The photo-curable composition of the photo-curable transfer sheet (8) preferably contains acrylic resin to keep the mechanical strength after curing. Particularly it is preferred to contain the acrylic resin in the amount of 0 to 50% by weight, especially 5 to 50% by weight to obtain the mechanical durability. Further, it is preferred to use the acrylic resin having a glass transition temperature (Tg) of 50 to 130° C., preferably 60 to 100° C., especially 60 to 80° C.; weight average molecular weight of 5,000 to 1,000,000, preferably 50,000 to 500,000; number average molecular weight of 5,000 to 1,000,000, preferably 50,000 to 500,000 to enhance the durability.

The photo-curable composition preferably contains a reactive diluent having a photopolymerizable functional group(s) to adjust the properties of the composition. The photo-curable composition preferably contains the reactive diluent in the amount of 0 to 50% by weight to have an appropriate curing property.

Further the present invention is provided by:

an optical information recording medium comprising a cured layer of a photo-curable composition having an uneven surface of recorded pits and/or grooves and a reflective layer of a silver, silver alloy or silver compound formed on the uneven surface, wherein the photo-curable composition is the composition of the photo-curable transfer sheet (8);

an optical information recording medium comprising an optical information recording substrate having an uneven surface of recorded pits and/or grooves, a reflective layer of a silver, silver alloy or silver compound formed on the uneven surface, and a cured layer of a photo-curable composition in close contact with the uneven surface of the reflective layer, wherein the photo-curable composition is the composition of the photo-curable transfer sheet (8); and an optical information recording medium comprising an optical information recording substrate having an uneven surface of recorded pits and/or grooves and a reflective layer of a silver or silver alloy formed on the uneven surface, and another optical information recording substrate having an uneven surface of recorded pits and/or grooves and a reflective layer of a silver or silver alloy formed on the uneven surface, the two optical information recording substrates being bonded to each other through a cured layer of a photo-curable composition such that the uneven surfaces of the reflective layers face with each other, wherein the photo-curable composition is the composition of the photo-curable transfer sheet (8).

Also the present invention is provided by the photo-curable compositions of the photo-curable transfer sheets (6) to (8).

In the photo-curable transfer sheets (1) to (8) mentioned above, the photo-curable transfer sheets further having a release sheet provided on one side or both sides can be used, especially in the following process. The photo-curable transfer sheets preferably are in the form of continuous length, and have the approximately same width as the release sheet.

Moreover, the present invention is also provided by:

a process for the preparation of an optical information recording medium comprising of the steps (2) to (4):

a step (2) of removing the release sheet on one side of the above-mentioned photo-curable transfer sheet ((1) to (8)), a step (3) of placing the photo-curable transfer sheet on an uneven surface of a reflective layer, such that the photo-curable transfer layer is in contact with the uneven surface, the reflective layer being formed on an uneven surface of a substrate having the uneven surface of recorded pits and/or grooves, and depressing the photo-curable transfer sheet and the substrate to form a laminate in which the one side of the photo-curable transfer sheet adheres closely to the uneven surface of the reflective layer, and a step (4) of removing the release sheet on the other side of the photo-curable transfer layer of the laminate.

In the process, prior to the step (2), the following step (1) is preferably performed:

a step (1) of punching out a disc from the photo-curable transfer sheet, or a step (1) of punching out a disc comprising the photo-curable transfer layer and the one side release sheet from the photo-curable transfer sheet without punching out the other side release sheet.

Further, after the step (4), the following steps (5) and (6) are preferably performed:

a step (5) of placing an uneven surface of a stamper having the uneven surface of recorded pits and/or grooves on the surface having no release sheet of the laminate, and depressing the photo-curable transfer sheet and the stamper to form a laminate in which the surface of the photo-curable transfer layer adheres closely to the uneven surface of the stamper, and a step (6) of exposing the laminate having the stamper to ultraviolet rays to cure the photo-curable transfer layer, and removing the stamper from the laminate to form an uneven surface on the photo-curable transfer layer.

Furthermore, after steps (5) and (6), the following step (7) is preferably performed:

a step (7) of forming a reflective layer on the uneven surface of the photo-curable transfer layer.

The present invention is also provided by an optical information recording medium obtainable by the above-mentioned process.

DETAILED DESCRIPTION OF THE INVENTION

Embodiments of the invention are explained in detail by referring to drawings.

Figure 1:
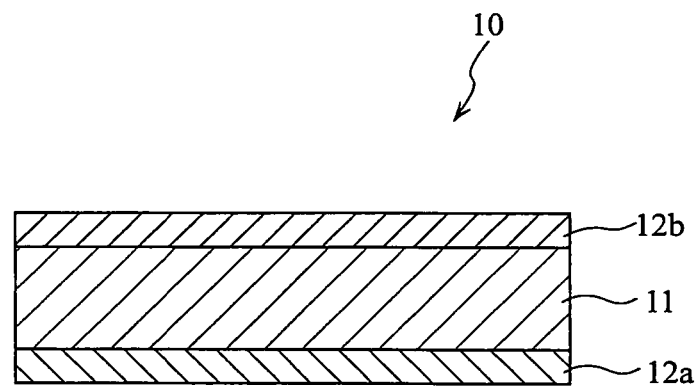
FIG. 1 is a section view showing an example of an embodiment of the photo-curable transfer sheet of the present invention.

FIG. 1 is a section view showing an example of an embodiment of the photo-curable transfer sheet of the present invention. FIG. 1 shows a photo-curable transfer sheet 10 consisting of a photo-curable transfer layer 11 and a release sheet 12a, 12b on both sides of the layer 11. The release sheet 12a, 12b may be provided on one side of the layer 11. Otherwise the release sheet 12a, 12b may be not provided. The provision way of the release sheet can be selected depending the uses.

The photo-curable transfer layer 11 is easily deformable by application of pressure such that unevenness of a stamper can be precisely transferred to the layer by depressing the stamper and the layer, and is largely repressed in the bleeding of the components of the transfer layer and occurrence of the variation of the thickness of the transfer layer by slightly curing the reactive polymer.

Thus, the photo-curable transfer layer of the present invention is a layer that shows linearity in relationship between strain [γ] (%) and time [t] (second) determined by a creep test using a dynamic viscoelasticity measuring apparatus under the conditions of an ordinary temperature, stress of 50 Pa and a time period of 120 seconds, and satisfies a following formula:

$$\log \gamma = a + b \cdot \log t$$

in which "a" is a real number, and "b" is in the range of 0.10 to 0.55 (especially 0.53). The photo-curable transfer sheet (1) satisfying the above conditions is largely repressed in the bleeding of the components of the transfer layer, and is excellent in the transfer properties to a substrate or stamper. When "b" is more than 0.55, the bleeding is apt to occurs whereas when "b" is less than 0.10, the transfer properties are liable to be lowered in the preparation of an optical information recording medium.

The photo-curable transfer layer 11 is, for example, a layer (photo-curable transfer sheet (2)) containing a reactive polymer having a photopolymerizable functional group and a functional group having active hydrogen, and further a small amount of a compound (especially diisocyanate compound) having at least two groups reactive to the functional group having active hydrogen of the polymer. The compound is reacted with the polymer to be slightly crosslinked with each other during the processing or storage of the sheet having the transfer layer, which results in the repression of the bleeding of the transfer layer and of the variation (fluctuation) of the thickness of the layer.

The photo-curable transfer layer 11 is, for example, a layer (photo-curable transfer sheet (3)) containing a reactive polymer having a photopolymerizable functional group, and further a tackifier having solubility parameter (SP value) of not less than 8.50. The use of the tackifier gives appropriate viscosity and stickiness to the transfer layer, which results in the repression of the bleeding of the transfer layer and the variation of the thickness of the layer. The addition of the tackifier does not impair the transfer properties during the preparation of the optical information recording medium.

The photo-curable transfer layer 11 is, for example, a layer (photo-curable transfer sheet (4)) containing a reactive polymer having a photopolymerizable functional group and a transparent fine particle having mean particle size of not more than 300 nm. This feature results in the repression of the bleeding of the transfer layer and of the variation of the thickness of the layer.

The photo-curable transfer layer 11 is, for example, a layer (photo-curable transfer sheet (5)) having the specific storage elastic moduli so as to transfer precisely an uneven surface of a stamper to the layer by depressing the uneven surface even at an ordinary temperature; i.e., a layer deformable by application of pressure having the storage elastic moduli of $1 \times 10^3$ to $9 \times 10^4$ Pa at frequency of 1 Hz and a temperature of 25° C., of not less than $5 \times 10^3$ Pa (especially not less than $8 \times 19^3$ P) at a frequency of 0.01 Hz and a temperature of 25° C., and of not more than $1\times10^7$ Pa (especially not more than $5\times10^6$ P) at frequency of 100 Hz and a temperature of 25° C.

The photo-curable transfer layer 11 is, for example, a layer (photo-curable transfer sheet (6)) containing a reactive polymer having a photopolymerizable functional group, and a phenol compound having a substituent in the amount of 0.01 to 0.3% by weight. When the layer is cured on the reflective layer of silver or silver alloy, the cured layer fully protects the reflective layer.

The photo-curable transfer layer 11 is, for example, a layer (photo-curable transfer sheet (7)) containing a reactive polymer having a photopolymerizable functional group, a surface of the cured layer having a water contact angle of not less than 60 degrees (preferably not less than 65 degrees), so as to transfer precisely an uneven surface of a stamper to the layer by depressing the stamper and the layer even at an ordinary temperature. Hence, the surface of the cured layer is configured to have extremely hydrophobic property.

The photo-curable transfer layer 11 is, for example, a layer (photo-curable transfer sheet (8)) containing a reactive polymer having a photopolymerizable functional group and further containing phosphoric acid (meth)acrylate or derivatives thereof in the amount of 10 to 220 ppm, so as to transfer precisely an uneven surface of a stamper to the layer by depressing the stamper and the layer even at an ordinary temperature. When the layer is cured on the reflective layer of silver or silver alloy, the cured layer fully protects the reflective layer.

In the photo-curable transfer sheet, the photo-curable composition (especially the reactive polymer) constituting the photo-curable transfer layer 11 preferably has a glass transition temperature of not more than 20° C., especially 15 to −10° C. Further, the photo-curable transfer layer 11 preferably has a light transmittance of not less than 70% in a wavelength rang of 380 to 420 nm so as to easily read out information from the uneven surface of the sheet with a reading laser beam. The light transmittance in a wavelength rang of 380 to 420 nm is especially preferred not less than 80%. Thus, the optical information recording medium of the invention prepared by using the photo-curable transfer layer 11 is advantageously used in a method of reading out information from pit signals using a laser beam of wavelength of 380 to 420 nm.

Figure 2:
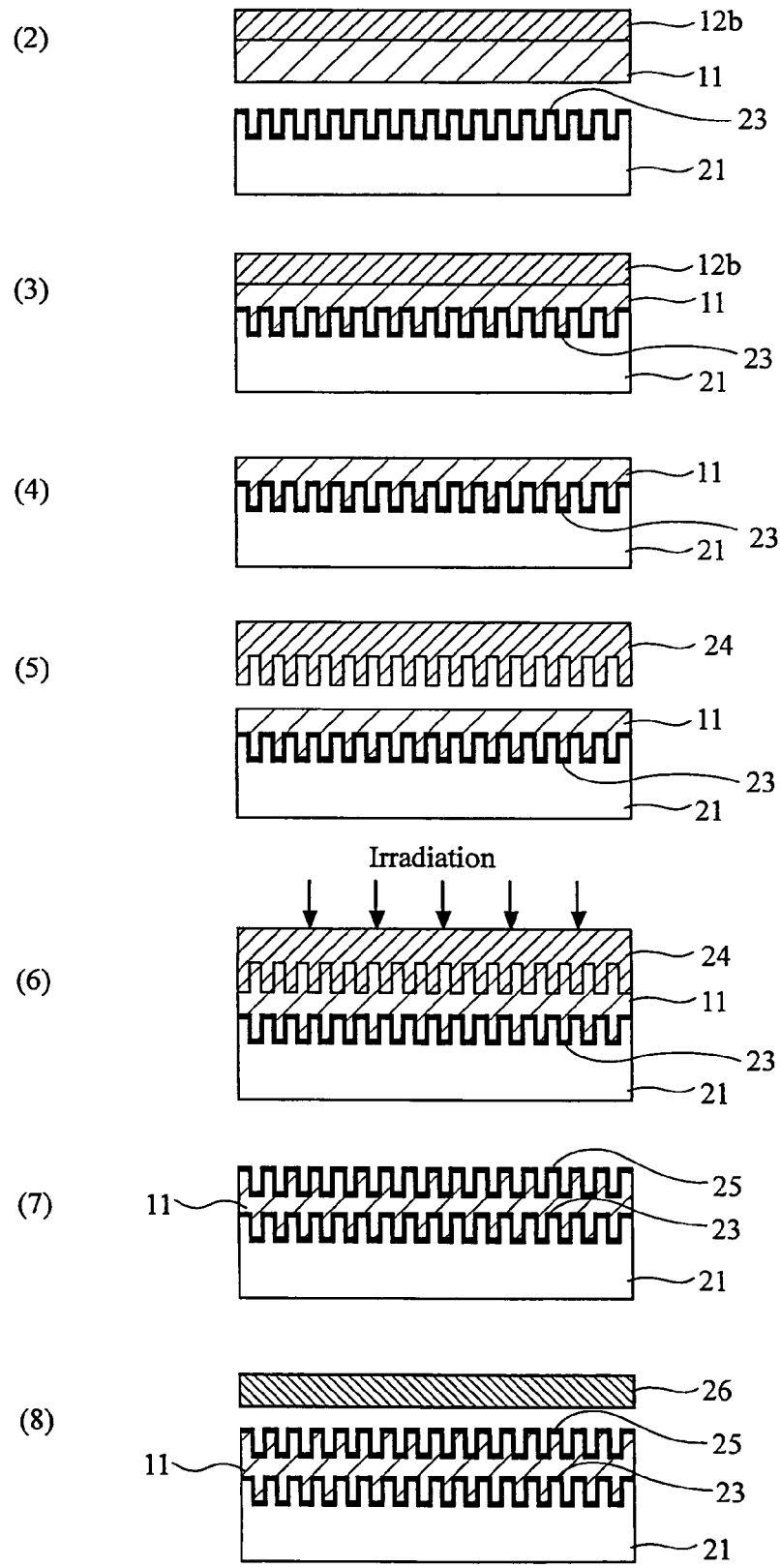
FIG. 2 is a section view showing an example of a process for preparing the optical information recording medium of the present invention.

The optical information recording medium can be prepared using the above photo-curable transfer sheet 10, for example, as shown in FIG. 2.

A disc (generally doughnut form having a through-hole in its center) is punched out from the photo-curable transfer sheet 10 (step 1). In this case, there are two methods; i.e., a method of punching out a disc comprising the photo-curable transfer layer 11 and the both sides release sheets 12a and 12b from the photo-curable transfer sheet, and a method of punching out a disc comprising the photo-curable transfer layer 11 and the one side release sheet 12b from the photo-curable transfer sheet without punching out the other side release sheet 12a. The former is generally referred to as full edge and the latter as dry edge, and these are expediently selected. Such punching process can be performed by using the photo-curable transfer sheet 10 without occurrence of bleeding or protrusion of the transfer layer and with good workability.

The release sheet 12a is removed from the photo-curable transfer sheet 10, and the photo-curable transfer layer 11 provided with the release sheet 12b is prepared (step 2). The photo-curable transfer sheet 10 is placed on an uneven surface of a half-transparent reflective layer 23, the reflective layer 23 being formed on an uneven surface of a substrate 21 having the uneven surface of recorded pits and/or grooves, such that the photo-curable transfer layer 11 is in contact with the uneven surface of the reflective layer 23 (step 3). The half-transparent reflective layer 23 generally is a reflective layer having relatively low reflectivity and comprising AgX, silver alloys, etc. Hence, a laminate in which the one side of the photo-curable transfer sheet 10 adheres closely to the uneven surface of the reflective layer 23 is formed, the laminate comprising the photo-curable transfer layer 11, reflective layer 23 and substrate 21. In case the structure (laminate) is used as an optical disc, the photo-curable transfer layer 11 is exposed to UV (ultraviolet ray) to be cured, and then the release sheet 12b is removed from the laminate.

Figure 3:
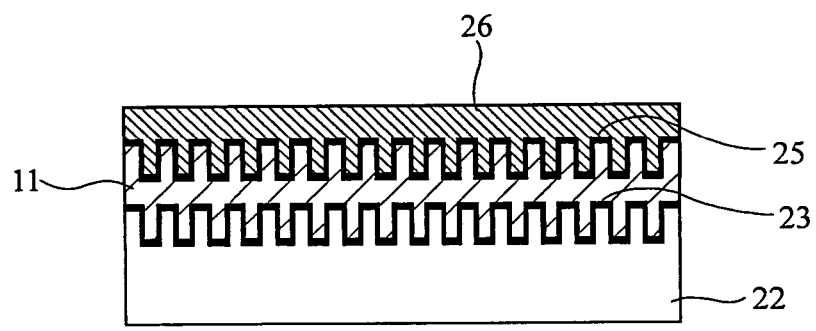
FIG. 3 is a section view showing an example of the optical information recording medium obtainable by the process of the present invention.

Subsequently, the release sheet 12b is removed from the laminate (step 4), and an uneven surface (i.e., a surface in noncontact with the substrate) of a stamper 24 having the uneven surface of recorded pits and/or grooves is placed on the surface having no release sheet of the photo-curable transfer layer 11 of the laminate to depress the photo-curable transfer sheet and the stamper 24 (step 5). Thus a laminate (comprising 21, 23, 11, 24) in which the surface of the photo-curable transfer sheet 10 adheres closely to the uneven surface of the stamper 24 is formed, and the photo-curable transfer layer 11 of the laminate is exposed to ultraviolet rays to be cured (step 6), and then the stamper 24 is removed from the laminate to form an uneven surface on the cured photo-curable transfer layer. Hence, a laminate (optical information recording medium) comprising the substrate 21, the reflective layer 23 and the cured photo-curable transfer layer 11 is obtained. Generally, on the uneven surface of the cured photo-curable transfer layer 11, a reflective layer (generally a high reflective layer comprising Al or the like) 25 is formed (step 7). Further, an organic polymer film (cover layer) 26 is bonded onto the reflective layer 25 through an adhesive layer (step 8). Hence, an optical information recording medium as shown in FIG. 3 is obtained. A photo-curable transfer sheet 10 may be depressed on the uneven surface of the reflective layer and cured by ultraviolet rays. Otherwise, an ultraviolet curable resin may be applied onto the uneven surface of the reflective layer and cured by ultraviolet rays. Further, the reflective layer 25 may be changed from a half-transparent reflective layer to a high reflective layer, and the reflective layer 23 may be changed from a high reflective layer to a half-transparent reflective layer. Moreover, the stamper may be a substrate having uneven surface.

In the step 7, a half-transparent reflective layer is formed the uneven surface of the cured photo-curable transfer layer instead of the high reflective layer, and by repeating the steps (2) to (7), three or more uneven surfaces (recorded pits) can be formed.

In the above process, the optical information recording medium exclusively used for reproduction is explained. However, an optical information recording medium used for recording (writing) is also prepared in the same manner as the above process. In the recordable medium, for example, grooves, or grooves and pits is provided instead of the pits, and a metal recording layer is provided instead of the reflective or semitransparent reflective layer. When the recording layer is a dye-recording layer or a recording layer having low reflectivity, a recording layer and reflective layer are generally provided. Besides these points, the recordable medium can be also prepared in the same manner as above.

In the invention, the photo-curable transfer sheet 10 is configured such that the uneven shape corresponding to recorded pits of the substrate 21 can be precisely transferred to the photo-curable transfer layer 11 by depressing the layer (sheet) 11 and the substrate 21 at low temperature of 100° C. or less (preferably an ordinary temperature). Superposition of the substrate 21 and the photo-curable transfer layer 11 is generally carried out using a pressure rollers or easy press (preferably under reduced pressure). The photo-curable transfer layer 11 after curing is strongly bonded to the metal used in the reflective layer provided on the substrate 21, and therefore is not peeled from the reflective layer. In necessary, an adhesion promoting layer may be formed on the reflective layer.

In the invention, the photo-curable transfer sheet 10 is configured such that the uneven shape corresponding to recorded pits of the stamper 24 can be precisely transferred to the photo-curable transfer layer 11 by depressing the layer (sheet) 11 and the stamper 24 at low temperature of 100° C. or less (preferably an ordinary temperature). Superposition of stamper 24 and the photo-curable transfer layer 11 is generally carried out using a pressure rollers or easy press (preferably under reduced pressure). The photo-curable transfer layer 11 after curing is weakly stuck to metal such as nickel used in the stamper 24, and therefore the photo-curable transfer layer 11 can be easily peeled from the stamper 24.

The substrate 21 generally is s thick plate (generally a thickness of 0.3 to 1.5 mm, especially approx. 1.1 mm), and therefore generally prepared by a conventional injection molding process. However, the photo-curable transfer layer and stamper are used for preparing the optical information recording medium without the substrate. The photo-curable transfer sheet can be prepared in a small thickness of not more than 300 µm (especially not more than 150 µm), and therefore the thickness of the substrate prepared by the conventional process can be increased to enhance the precision of the form of pits.

In the process, when the photo-curable transfer layer is depressed on the substrate, or when the stamper is depressed on the photo-curable transfer layer, it is preferred to carry out the depressing operation under reduced pressure, whereby the deaeration treatment in the operation can be easily carried out.

The depressing operation under the reduced pressure can be performed by a method comprising passing a photo-curable transfer sheet and a stamper between two rolls under reduced pressure; or by a method comprising placing a stamper in a mold of a vacuum molding device and bringing a photo-curable adhesive sheet into contact with the stamper under reduced pressure to depress them.

Figure 4:
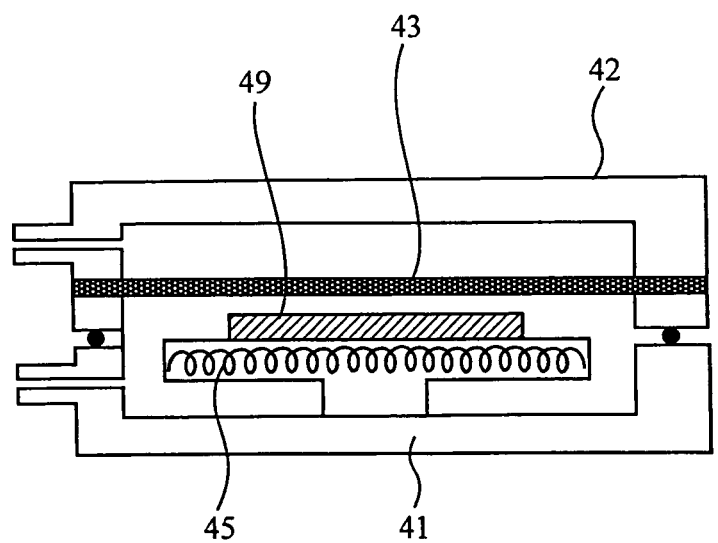
FIG. 4 is a schematic view for explaining a depressing method using a device according to a double vacuum chamber system.

Further, the depressing operation under the reduced pressure can be performed using a device according to a double vacuum chamber system. The operation is explained by referring to FIG. 4. FIG. 4 shows an example of a laminator according to a double vacuum chamber system. The laminator is provided with a lower chamber 41, an upper chamber 42, a sheet of silicone rubber 43 and a heater 45. A laminate 49 consisting of a substrate having an uneven surface and a photo-curable transfer sheet provided thereon or consisting of a substrate, transfer sheet and stamper is placed in the lower chamber 41 of the laminator. Both the upper chamber 42 and lower chamber 41 are degassed or decompressed. The laminate 49 is heated with a heater 45, and air is introduced into the upper chamber 42 to allow the chamber to be at atmospheric pressure while the lower chamber 41 is kept under reduced pressure, whereby the laminate is depressed to be contact bonded. After cooling, the laminate is taken out and transformed to the next step. This operation permits sufficient deaeration under reduced pressure, and therefore, the stamper or substrate and the photo-curable transfer sheet can be contact bonded without bubbles.

Optical information recording media of the invention, which can be prepared by the process for the preparation of the optical information recording medium of the invention as mentioned above, are shown in FIGS. 5 and 6. However, the optical information recording media of the invention include any optical discs that can be prepared by using the photo-curable transfer sheet or the photo-curable composition, and hence are not restricted to those prepared by the process of the invention.

Figure 5:
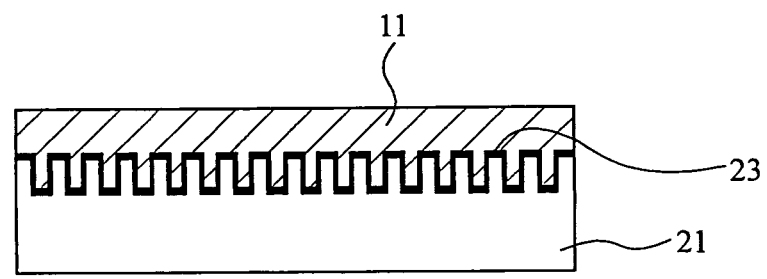
FIG. 5 is a section view showing an example of the optical information recording medium of the present invention.

FIG. 5 is a section view showing an example of embodiments of the optical information recording medium of the invention. FIG. 5 shows a laminate (i.e., optical information recording medium) comprising a substrate 21 having an uneven surface as recorded pits (and/or groove(s)), a reflective layer (semi-transparent reflective layer, i.e., low reflective layer) 23 formed from silver or silver alloy [e.g., ANC (alloy of Ag, Nd and Cu), APC (alloy of Ag, Pd and Cu)], and a cured layer 11. The cured layer 11 is a layer obtained by curing a photo-curable transfer layer or a photo-curable composition of the invention. A laminate that the substrate 21 is excluded from the medium of FIG. 5, i.e., comprising the reflective layer 23 formed from silver or silver alloy and the cured layer 11, is also the medium of the invention. In more detail, if the cured layer has self-supporting property, even the medium having no substrate can be used as it is. Otherwise, the medium having no substrate can be advantageously used in an embodiment having a protective layer instead of the substrate.

Figure 6:
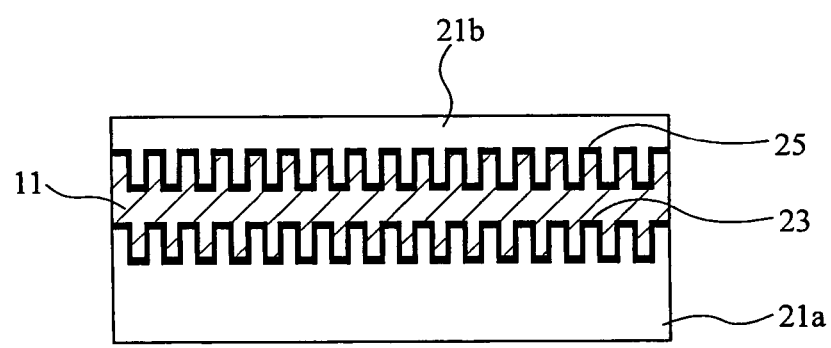
FIG. 6 is a section view showing another example of the optical information recording medium of the present invention.

FIG. 6 is a section view showing an example of embodiments of the optical information recording medium of the invention. FIG. 6 shows an optical information recording medium which comprises one plate comprising a substrate 21a having an uneven surface as recorded pits (and/or groove(s)), a reflective layer (semi-transparent reflective layer, i.e., low reflective layer) 23 formed from silver or silver alloy which is provided on the substrate 21a, and another plate comprising a substrate 21b having an uneven surface as recorded pits (and/or groove(s)), a reflective layer (high reflectivity layer) 25 formed from aluminum which is provided on the substrate 21b, the two plates being superposed on each other through a cured layer 23 of the invention such that the reflective layers face each other.

As previously described in the process for the preparation of the optical information recording medium, the medium may have an organic polymer film (cover layer) 26 instead of the substrate 21b which is provided on the reflective layer 25 of aluminum or the like.

In the invention, the cured layer 11 provided on the uneven surface of the reflective layer (semi-transparent reflective layer, i.e., low reflective layer) 23 formed from silver or silver alloy is formed by curing the photo-curable transfer layer (or the photo-curable composition) of the photo-curable transfer sheet (1) to (8). Hence, the cured layer shows the advantages described previously in the transfer sheet.

In the medium having the cured layer prepared using one of the photo-curable transfer sheets (6) to (8), the cured layer strongly bonds to the reflective layer and its high film strength protects the reflective layer. In case the cured layer contains a phenol compound having substituent(s), the reflective layer is extremely prevented from reduction of the reflectivity because the cured layer is configured to effectively realize antioxidant function of the compound. Hence, the optical information recording medium having the above cured layer shows excellent durability.

In case the cured layer provided on the uneven surface of the reflective layer (semi-transparent reflective layer, i.e., low reflective layer) 23 of silver or silver alloy is configured to have a water contact angle of not less than 60 degrees (preferably not less than 65 degrees), i.e., to have extremely hydrophobic property, the cured layer prevents water from invading in the reflective layer under the conditions of high temperature and humidity and therefore represses reduction of the reflectivity of the reflective layer due to corrosion of the reflective layer or occurrence of film defects such as peeling of the layer over a long period. Hence, the optical information recording medium having the above cured layer shows excellent durability.

Further, in case the cured layer provided on the uneven surface of the reflective layer (semi-transparent reflective layer, i.e., low reflective layer) 23 of silver or silver alloy contains phosphoric acid (meth)acrylate or derivatives thereof, the cured layer highly bonds to the reflective layer and protects the reflective layer against its yellowing whereby reduction of the reflectivity of the reflective layer is repressed. Hence, the optical information recording medium having the above cured layer shows excellent durability.

Materials of silver alloy the reflective layer of the optical information recording medium include conventional silver alloys or the like used in the reflective layer, preferably, for example, silver alloy ANC (alloy of Ag, Nd and Cu), and APC (alloy of Ag, Pd and Cu).

The photo-curable transfer sheet that can be advantageously used in the process of the invention has a structure of one of the above-mentioned photo-curable transfer sheets (1) to (8), especially (1) to (5). Thus the photo-curable transfer sheet of the invention has the photo-curable transfer layer comprising the photo-curable composition deformable by application of pressure.

The photo-curable transfer sheets (1) is advantageously obtained by appropriately utilizing the composition constituting the photo-curable transfer layer of one of the photo-curable transfer sheets (2) to (8), especially (2) to (5).

The photo-curable composition constituting the photo-curable transfer sheet (2) is first explained. The photo-curable composition is generally composed mainly of the reactive polymer having a photopolymerizable functional group and a functional group containing active hydrogen (generally having a glass transition temperature of not more than 20° C.), a compound having at least two groups reactive to the functional group having active hydrogen, a compound (e.g., monomer or oligomer) having a photopolymerizable functional group (preferably (meth)acryloyl group), a photopolymerization initiator and if necessary other additives.

Examples of the reactive polymer having a photopolymerizable functional group and a functional group having active hydrogen include homopolymers or copolymers (i.e., acrylic resins) derived from alkyl acrylate (e.g., methyl acrylate, ethyl acrylate, butyl acrylate, 2-ethylhexyl acrylate) and/or alkyl methacrylate (e.g., methyl methacrylate, ethyl methacrylate, butyl methacrylate, 2-ethylhexyl methacrylate) and having a photopolymerizable functional group and active hydrogen-containing group on its main chain or side chain. These reactive (co)polymers can be obtained, for example, by copolymerizing one or more (meth)acrylate mentioned above with (meth)acrylate (e.g., 2-hydroxyethyl (meth)acrylate) having a active hydrogen-containing group such as —OH and reacting the resultant polymer with a compound (e.g., isocyanatoalkyl (meth)acrylate) having a functional group capable of reacting with the active hydrogen-containing group of the polymer and having a photopolymerizable functional group. In the latter reaction, the amount of the compound (e.g., isocyanatoalkyl (meth)acrylate) having a functional group capable of reacting with the active hydrogen containing group is adjusted so as to leave the active hydrogen containing group. Thus, the reactive polymer having the photopolymerizable functional group and the active hydrogen-containing group can be obtained.

Otherwise, in the reaction, the use of (meth)acrylate (e.g., 2-aminoethyl (meth)acrylate) having an amino group instead of the acrylate having a OH group results in a reactive polymer having the photopolymerizable functional group and the amino group as the active hydrogen-containing group. Similarly a reactive polymer having the photopolymerizable functional group and a carboxyl group as the active hydrogen-containing group.

Though the photopolymerizable group is formed by using isocyanatoalkyl (meth)acrylate in the above reaction, other methods, for example, a method of preparing acrylic resin having a carboxyl group and reacting the carboxyl group with (meth)acrylate having an epoxy group (e.g., glycidyl (meth)acrylate) to form the photopolymerizable group can be used.

In the invention, the acrylic resin having photopolymerizable functional group through urethane bond as mentioned above is preferred.

The reactive polymer of the invention has generally 1 to 50% by mole, preferably 5 to 30% by mole of the photopolymerizable functional group. Examples of the photopolymerizable functional group preferably include acryloyl, methacryloyl and vinyl groups, especially acryloyl and methacryloyl groups.

The reactive polymer of the invention generally has also 0.1 to 10% by mole, preferably 0.5 to 5% by mole of the active hydrogen-containing functional group such as hydroxyl group, whereby such appropriate crosslinking of the transfer layer so as to prevent bleeding of the transfer layer can be easily obtained.

The reactive polymer of the invention generally has a glass transition temperature of not more than 20° C. In case the reactive polymer having glass transition temperature of not more than 20° C. is used, the resultant photo-curable sheet having flexibility can follow exactly the uneven surface of the stamper even at room temperature when the sheet is depressed on the stamper. The reactive polymer especially has a glass transition temperature of 15 to −50° C. because the resultant photo-curable layer can follow more exactly the uneven surface. When the glass transition temperature exceeds the upper limit, high pressure and temperature are needed in the depressing and bonding steps of the sheet, which brings about lowering of workability. When the glass transition temperature falls to below the lower limit, the resultant cured sheet does not have sufficient hardness.

The reactive polymer of the invention generally has number-average molecular weight of 5,000 to 1,000,000, preferably 10,000 to 300,000, and/or generally has weight-average molecular weight of 5,000 to 1,000,000, preferably 10,000 to 300,000.

The compound having at least two groups reactive to an active hydrogen-containing functional group generally is isocyanate compounds or epoxy compounds. The isocyanate compounds can be advantageously used due to high reactivity at an ordinary temperature.

Examples of the compound having at least two groups include tolylene diisocyanate (TDI), isophorone diisocyanate, xylylene diisocyanate, diphenylmethane-4,4'-diisocyanate, dicyclopentyl diisocyanate, hexamethylene diisocyanate, 2,4,4'-trimethylhexamethylene diisocyanate, 2,2',4-trimethylhexamethylene diisocyanate. Further three or more functional isocyanate compounds such as TDI adduct of trimethylol propane and hexamethylene diisocyanate adduct of trimethylol propane can be employed. Of these compounds, hexamethylene diisocyanate adduct of trimethylol propane is preferred.

The compound having at least two groups reactive to an active hydrogen containing functional group is preferably 0.2 to 4% by weight, especially 0.2 to 2% by weight in the photo-curable composition, which results in appropriate crosslinking of the transfer layer to prevent the transfer layer from bleeding with maintaining good transfer property between the transfer layer and the uneven surface of substrate or stamper. The reaction of the above compound with the reactive polymer gradually progresses after the provision of the transfer layer, for example, progresses to a large degree at an ordinary temperature (generally 25° C.) for 24 hours. Also it is considered that the polymer and diisocyanate in a coating solution for forming the transfer layer slightly are reacted with each other in the term from its preparation to its coating. Because it is preferred that the transfer layer is cured to a large degree between the provision of the transfer layer and the rolling up of the resultant transfer layer, the curing of transfer layer may be promoted by heating during or after of the provision of the transfer layer, or before the rolling up.

Subsequently, the photo-curable composition constituting the photo-curable transfer sheet (3) is explained. The photo-curable composition is generally composed mainly of a reactive polymer having a photopolymerizable functional group (generally having a glass transition temperature of not more than 20° C.), a tackifier having solubility parameter (SP value) of not less than 8.50, a compound (e.g., monomer or oligomer) having a photopolymerizable functional group (preferably (meth)acryloyl group), a photopolymerization initiator and if necessary other additives.

Examples of the reactive polymer having a photopolymerizable functional group include homopolymers or copolymers (i.e., acrylic resins) derived from alkyl acrylate (e.g., methyl acrylate, ethyl acrylate, butyl acrylate, 2-ethylhexyl acrylate) and/or alkyl methacrylate (e.g., methyl methacrylate, ethyl methacrylate, butyl methacrylate, 2-ethylhexyl methacrylate) and having a photopolymerizable functional group on its main chain or side chain. These (co)polymers can be obtained, for example, by copolymerizing one or more (meth)acrylate mentioned above with (meth)acrylate (e.g., 2-hydroxyethyl (meth)acrylate) having a functional group such as a hydroxyl group and reacting the resultant polymer with a compound (e.g., isocyanatoalkyl (meth)acrylate) having a functional group capable of reacting with the functional group of the polymer and having a photopolymerizable functional group.

Otherwise, in the reaction, the use of (meth)acrylate (e.g., 2-aminoethyl (meth)acrylate) having an amino group or (meth)acrylate having a carboxyl group instead of the (meth)acrylate having a OH group results in a reactive polymer having the photopolymerizable functional group.

Though the photopolymerizable group is formed by using isocyanatoalkyl (meth)acrylate in the above reaction, other methods, for example, a method of forming acrylic resin having a carboxyl group and reacting the carboxyl group with (meth)acrylate having an epoxy group (e.g., glycidyl (meth)acrylate) to form the photopolymerizable group, can be used.

In the invention, the acrylic resin having photopolymerizable functional group through urethane bond as mentioned above is preferred.

The above reactive polymer of the invention has generally 1 to 50% by mole, preferably 5 to 30% by mole of the photopolymerizable functional group. Examples of the photopolymerizable functional group preferably include acryloyl, methacryloyl and vinyl groups, especially acryloyl and methacryloyl groups.

The above reactive polymer of the invention generally has a glass transition temperature of not more than 20° C. In case the reactive polymer having glass transition temperature of not more than 20° C. is used, the resultant photo-curable sheet having flexibility can follow exactly the uneven surface of the stamper even at room temperature when the sheet is depressed on the stamper. The reactive polymer especially has a glass transition temperature of 15 to −50° C. because the resultant photo-curable layer can follow more exactly the uneven surface. When the glass transition temperature exceeds the upper limit, high pressure and temperature are needed in the depressing and bonding steps of the sheet, which brings about lowering of workability. When the glass transition temperature falls to below the lower limit, the resultant cured sheet does not have sufficient hardness.

The above reactive polymer of the invention generally has number-average molecular weight of 5,000 to 1,000,000, preferably 10,000 to 300,000, and/or generally has weight-average molecular weight of 5,000 to 1,000,000, preferably 10,000 to 300,000.

The invention (photo-curable transfer sheet (3)) has the feature that the photo-curable composition contains a tackifier having solubility parameter (SP value) of not less than 8.50. As the tackifier, any resins that generally are used in rubber industry as tackifier and satisfy the SP value can be employed. The tackifier is generally used to enhance tackiness of a surface of a composition obtained by adding the tackifier into natural rubber, synthetic rubber, rubber adhesive or plastics.

Examples of the tackifier include coumarone resins such as coumarone-indene resins and a mixture of coumarone resin/naphthenic oil/phenol resin; terpene resins such as terpene resins, modified terpene resins (e.g., aromatic-modified terpene resins), terpene phenol resins and hydrogenated terpene resins; rosin derivatives such as gum rosins, tall oil rosins, wood rosins, pentaerythritol esters of rosin, glycerol esters of rosin, hydrogenated rosins, hydrogenated wood rosins, methyl esters of hydrogenated rosin, triethylene glycol esters of hydrogenated rosin, disproportionated rosins, polymerized rosins, glycerol esters of polymerized rosin and cured rosins; turpentine containing tackifiers; petroleum hydrocarbon resins such as aromatic hydrocarbon resins, aliphatic hydrocarbon resins, unsaturated hydrocarbon (olefin series, diolefin series) polymers, isoprene resins, hydrogenated hydrocarbon resins, tackified hydrocarbon resins, polybutene, liquid polybutadiene and low molecular butyl rubber; styrene resins; phenol resins; and xylene resins. Of these resins, terpene resins and various esters of rosin, especially hydrogenated terpene resins and various esters of rosin are preferred.

Examples of commercial products of the takifier of the invention include YS Resin TR105 (terpene resin; SP value=8.26; m.p.=105° C.; Tg=50° C.; mean molecular weight=600) available from Yasuhara Chemical; Cryaron M115 (hydrogenated terpene resin; SP value=8.52; m.p.=115° C.; Tg=59° C.; mean molecular weight=650) available from Yasuhara Chemical; YS Polyster TH130 (terpene phenol resin; SP value=8.81; m.p. =130° C.; Tg=74° C.; mean molecular weight=710) available from Yasuhara Chemical; Pine Crystal KE-100 (rosin ester; SP value=approx. 8.5; m.p.=95-105° C.; acid value=2-10) available from Arakawa Chemical Industries. Ltd.; and Pine Crystal KE-359 (rosin ester; SP value=approx. 8.6; m.p.=94-104° C.; acid value=10-20) available from Arakawa Chemical Industries. Ltd.

The tackifier of the invention preferably has the solubility parameter (SP value) of 8.50 to 9.50, especially 8.50 to 9.00. The tackifier is compatible with the reactive polymer and the reactive diluent used if necessary, and effectively imparts appropriate tackiness and viscous property to the transfer layer, i.e., the addition of a small amount of the tackifier gives the appropriate tackiness to the transfer sheet, which, for example brings about good adhesion between the transfer layer and release sheet. Hence the addition of the tackifier represses the bleeding of the transfer sheet in the form of roll and the variation of the thickness of the sheet.

The melting point of the tackifier is preferably in the range of 90 to 135° C., especially 90 to 120° C., and the glass transition temperature is preferably in the range of 40 to 70° C., especially 45 to 65° C. The number average molecular weight of the tackifier is preferably in the range of 600 to 800, especially 630 to 730, and the weight average molecular weight is preferably in the range of 600 to 800, especially 630 to 730. Further the rosin preferably has acid value of not more than 30.

The tackifier satisfying the above ranges especially shows excellent compatibility with the reactive polymer and displays outstandingly the effects of the invention.

The tackifier is preferably contained in the composition of the invention in the amount of 0.5 to 30% by weight, especially 1 to 20% by weight.

Subsequently, the photo-curable composition constituting the photo-curable transfer sheet (4) is explained. The photo-curable composition is generally composed mainly of a reactive polymer having a photopolymerizable functional group (generally having a glass transition temperature of not more than 20° C.), the transparent fine particle having mean particle size of not more than 300 nm, a compound (e.g., monomer or oligomer) having a photopolymerizable functional group (preferably (meth)acryloyl group), a photopolymerization initiator and if necessary other additives.

The use of the transparent fine particle having mean particle size pf not more than 300 nm represses the occurrences of bleeding or protrusion of (the components of) the photo-curable transfer layer in the form of roll, and of variation of the thickness of the layer, while the performances such as transferring property or photo-curability of the transfer layer are not impaired.

As the transparent fine particle, any inorganic or organic particles having mean particle size of not more than 300 nm and transparency can be used. Examples of the materials of the inorganic fine particles include glass bead, talc, silica, alumina, magnesia, zinc flower, calcium carbonate, barium sulfate, titanium dioxide, aluminum hydroxide, mica, feldspar powder and quartz powder. Examples of the organic fine particles include fine particles of acrylic resin (e.g., polymethyl methacrylate (PMMA)), polystyrene, styrene/acrylate copolymer, polyethylene, epoxy resin, silicone resin, polyvinylidene fluoride, Teflon (trademark), divinylbenzene/styrene, phenol resin, polyurethane, cellulose acetate, Nylon, cellulose, benzoguanamine resin and melamine resin. As the materials of transparent fine particle, silica, titanium oxide and polymethyl methacrylate, especially silica are preferred. The mean particle size of the particle is generally is in the range of 1 to 300 nm, preferably in the range of 1 to 200 nm. When the particle size is more than 300 nm, the transferring property is reduced. When the particle size is too small, the bleeding is not sufficiently repressed.

The mean particle size (primary particle size) of the (fine) silica particle is generally in the range of 1 to 300 nm, preferably in the range of 1 to 200 nm, especially in the range of 10 to 100 nm. The shape of the silica particle includes sphere, hollow, porous form, bar, plate, fiber or amorphous form, preferably sphere. Specific surface of the silica particles is generally in the range of 0.1 to 3,000 $m^2/g$, preferably in the range of 10 to 1,500 $m^2/g$. Specific pore volume (void volume) of the silica particles is generally in the range of 0.1 to 5 ml/g, preferably in the range of 0.2 to 2 ml/g.

The silica particle can be employed in the form of dried powder or in a dispersion of the particles in water or a solvent. The colloidal silica (silica powder dispersion) can be used as it is. In case a dispersing solvent of the colloidal silica is water, acidic colloidal silica whose hydrogen ion concentration is generally in the range of pH2 to pH 10, preferably pH 3 to pH7 is generally employed. In case a dispersing solvent of the colloidal silica is an organic solvent, the solvent generally includes methanol, isopropyl alcohol, ethylene glycol, butanol, ethylene glycol monopropyl ether, methyl ethyl ketone, methyl isobutyl ketone, toluene, xylene, dimethyl formamide and a mixture of the solvent and other organic solvent compatible with the solvent or a mixture of the solvent and water. Preferred are methanol, isopropyl alcohol, methyl ethyl ketone and xylene. Examples of trade names of colloidal silica as the fine silica particle, which are commercially available, include Methanol Silicasol, IPA-ST, MEK-ST, NBA-ST, XBA-ST, DMAC-ST and ST-UP, ST-OUP, ST-20, ST-40, ST-C, ST-N, ST-O, ST-50, ST-OL, which are available from Nissan Chemical Industries, Ltd. Examples of trade names of silica powder as the fine silica particle include Aerosil 130, Aerosil 300, Aerosil 380, Aerosil TT600 and Aerosil X50, which are available from Nippon Aerosil Co., Ltd., and Sildex H31, Sildex H32, Sildex H51, Sildex H52, Sildex H121 and Sildex H122, which are available from Asahi Glass Co., Ltd., Nipsil VN-3, Nipsil E220 and Nipsil E220, which are available from Nippon Silica Co., Ltd., Chemisnow MP, which are available from Soken Chemical & Engineering Co., Ltd., Silisia 470 which is available from Fuji Silisia Co., Ltd., and SG Flake which is available from Nippon Sheet Glass Co., Ltd. Preferred are Aerosil 130, Aerosil 300, Aerosil 380, Aerosil TT600 and Aerosil X50, Nipsil VN-3, and Chemisnow MP.

The transparent fine particle of the invention preferably us contained in the photo-curable composition in the amount of 0.5 to 20% by weight (weight ratio of the transparent fine particle to the composition containing the particle), especially 1 to 10% by weight. The use of the transparent fine particle in the amount advantageously represses the bleeding of the transfer sheet and the variation of the thickness of the sheet with maintaining the transparency of the layer.

As mentioned above, the photo-curable composition generally contains a reactive polymer having a photopolymerizable functional group (generally having a glass transition temperature of not more than 20° C.), a compound (e.g., monomer or oligomer) having a photopolymerizable functional group (preferably (meth)acryloyl group), a photopolymerization initiator and if necessary other additives with the exception of the transparent fine particle having mean particle size of not more than 300 nm.

As the reactive polymer having photopolymerizable functional group, those described in the photo-curable transfer sheets (2) and (3) can be used.

Subsequently, the photo-curable composition constituting the photo-curable transfer sheet (5) is explained. The photo-curable composition is generally composed mainly of a reactive polymer having a photopolymerizable functional group (generally having a glass transition temperature of not more than 20° C.), a plasticizing reactive diluent (e.g., monomer or oligomer) having a photopolymerizable functional group (preferably (meth)acryloyl group), a photopolymerization initiator and if necessary other additives.

The photo-curable transfer layer obtained from the above photo-curable composition has the specific storage elastic moduli such that an uneven surface of a stamper is precisely transferred to the transfer layer. Thus, the photo-curable transfer layer has storage elastic moduli of $1 \times 10^3$ to $1 \times 10^4$ Pa at frequency of 1 Hz and a temperature of 25° C., of not less than $5 \times 10^3$ Pa (especially not less than $8 \times 10^3$ Pa) at a frequency of 0.01 Hz and a temperature of 25° C., and of not more than $1 \times 10^7$ Pa (especially not more than $5 \times 10^6$ Pa) at frequency of 100 Hz and a temperature of 25° C. The storage elastic modulus at frequency of 0.01 Hz is closely linked to the storage stability of uncured transfer layer, i.e., when the modulus is less than $5 \times 10^3$ Pa, the transfer layer generates bleeding at its sides or variation of the thickness during the storage in the form of roll. The storage elastic modulus at frequency of 100 Hz is closely linked to the hardness of the transfer layer when an uneven surface of a stamper is transferred to the transfer layer, i.e., when the modulus is more than $1 \times 10^7$ Pa, the uneven surface is not precisely transferred to the transfer layer due to insufficient transferring property of the transfer layer at a transferring temperature. The storage elastic modulus at frequency of 1 Hz is closely linked to the above both properties of the transfer layer, i.e., when the modulus is less than $1 \times 10^3$ Pa, the transfer layer is liable to generate variation of the thickness of the uncured layer, and when the modulus is more than $9 \times 10^4$ Pa, defective transfer is liable to occur.

The photo-curable transfer layer having the specific storage elastic moduli can be obtained by appropriately combining mainly the kind and amount of the reactive polymer and the plasticizing reactive diluent.

As the reactive polymer having photopolymerizable functional group, those described in the photo-curable transfer sheets (2) and (3) can be used.

The plasticizing reactive diluent can be appropriately selected from the compounds (reactive diluents) having photopolymerizable functional group as mentioned later. Of the compound, those having molecular weight of not more than 1,000, further not more than 500, especially in the range of 200 to 400 are preferred. Examples of the compounds include tricyclodecanedimethylol di(meth)acrylate, 1,6-hexanediol di(meth)acrylate, nonanediol di(meth)acrylate, and 1,4-butanediol di(meth)acrylate. The acrylates are particularly preferred in the invention. The plasticizing reactive diluent is added in the amount of not less than 10% by weight, further not less than 20% by weight, especially not less than 25% by weight (the upper limit generally being 40% by weight) based on the photo-curable composition. The weight ratio of the reactive polymer to the plasticizing reactive diluent is generally in the range of 60:10 to 60:50, preferably in the range of 60:20 to 60:50, especially in the range of 60:20 to 60:45 (polymer:diluent).

Subsequently, the photo-curable composition constituting the photo-curable transfer sheet (6) is explained. The photo-curable composition is generally composed mainly of a reactive polymer having a photopolymerizable functional group (generally having a glass transition temperature of not more than 20° C.), a phenol compound having substituent(s), a reactive diluent (e.g., monomer or oligomer) having a photopolymerizable functional group (preferably (meth)acryloyl group), acrylic resin, a photopolymerization initiator and if necessary other additives.

As the reactive polymer having photopolymerizable functional group, those described in the photo-curable transfer sheets (2) and (3) can be used.

The phenol compound having substituent of the invention is generally employed as a polymerization inhibitor or anti-oxidant. As the phenol compound having substituent, preferred are hydroquinone compounds (hydroquinone or its derivatives), or hindered phenol compounds (hindered phenol or its derivatives). These compounds effectively function in the photo-curable composition containing the reactive polymer.

The phenol compound having substituent is contained in the amount of 0.01 to 0.3% by weight, further 0.01 to 0.2% by weight, especially 0.01 to 0.1% by weight based on the photo-curable composition. The use of such small amount represses yellowing of the reflective layer and enhances protective function of the reflective layer.

Preferred examples of the hydroquinone include 4-methoxyphenol, and preferred examples of the hindered phenol compound include the following compounds:

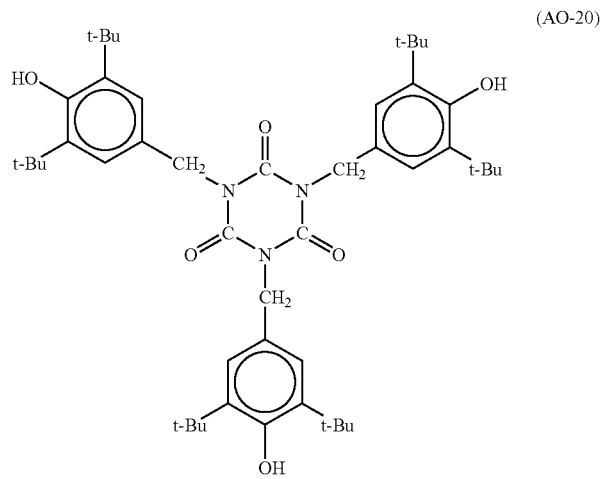
(AO-20)

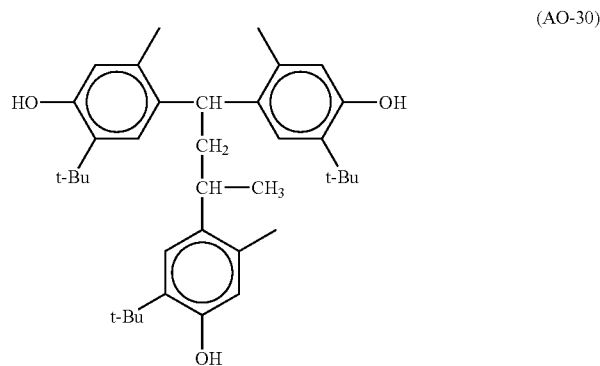
(AO-30)

(AO-40)
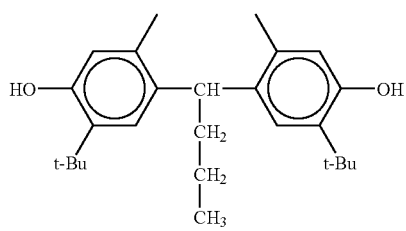

(AO-50)
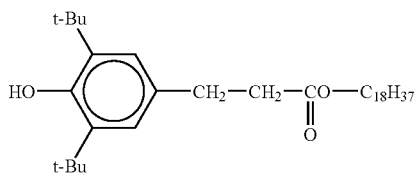

(AO-70)
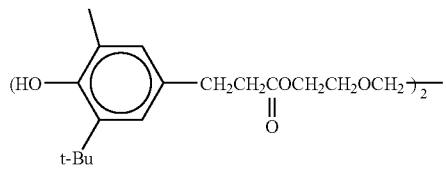

(AO-80)
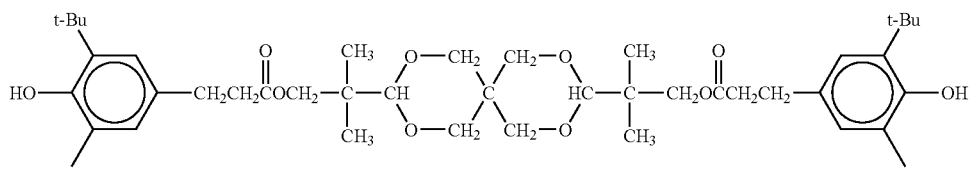

(AO-330)
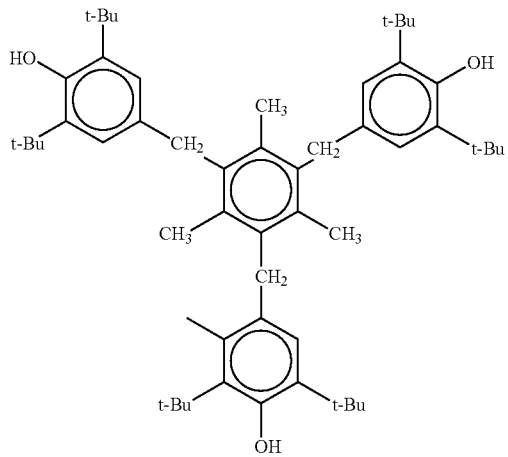

(AO-60)
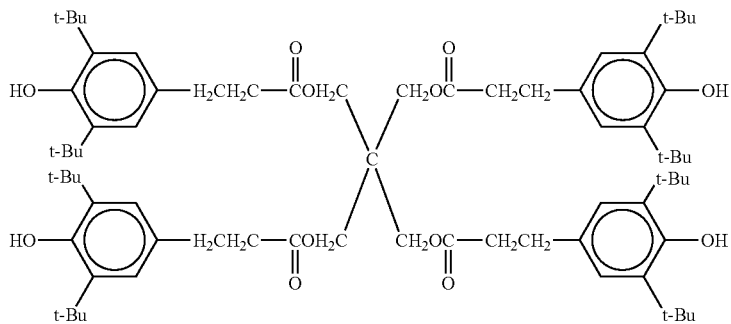

The above-mentioned compounds are commercially available from Asahi Denka Co., Ltd. as trade names of Adeka Stab AO-20, AO-30, A-40, AO-50, AO-60, A-70, AO-80, and AO-330. Especially preferred are the compounds having three or more phenol rings.

Subsequently, the photo-curable composition constituting the photo-curable transfer sheet (7) is explained. The photo-curable composition generally contains at least a reactive polymer having a photopolymerizable functional group (generally having a glass transition temperature of not more than 20° C.), and preferably further contains a reactive diluent (e.g., monomer or oligomer) having a photopolymerizable functional group, acrylic resin, a photopolymerization initiator and if necessary other additives.

As the reactive polymer having photopolymerizable functional group, those described in the photo-curable transfer sheets (2) and (3) can be used.

The photo-curable composition preferably contains the reactive diluent. Examples of the reactive diluent include branched alkane having two (meth)acryloyl groups, cyclic alkane having two (meth)acryloyl groups, long chain alkane having one (meth)acryloyl group, or cyclic alkane having one (meth)acryloyl group. The carbon atom number of the branched alkane generally is in the range of 4 to 10, preferably 4 to 8. The carbon atom number of the cyclic alkane generally is in the range of 5 to 15, preferably 5 to 12. The carbon atom number of the long chain alkane generally is not less than 10. The use of such reactive diluent is allowed to easily enhance a water contact angle of the surface of the cured transfer layer. Examples of the branched alkane having two (meth)acryloyl groups include neopentylglycol diacrylate (Light Acrylate NP-A, available from Kyoeisha Chemical Co., Ltd.), neopentylglycol dimethacrylate, 2-butyl-2-ethyl- 1,3-propandiol diacrylate, 2-butyl-2-ethyl-1,3-propandiol dimethacrylate, 3-methyl-1,5-pentandiol diacrylate, 3-methyl-1,5-pentandiol dimethacrylate. Examples of the cyclic alkane having two (meth)acryloyl groups include dimethyloltricyclodecane diacrylate (KAYARAD R-684, available from Nippon Kayaku), dimethyloltricyclodecane dimethacrylate.

Examples of the long chain alkane having (meth)acryloyl groups include isodecyl monoacrylate, isodecyl mononuthacrylate, n-lauryl monoacrylate, n-lauryl monomethacrylate, tridecyl monoacrylate, tridecyl monomethacrylate, n-stearyl monoacrylate, n-stearyl monomethacrylate, 1,10-decandiol monoacrylate, 1,10-decandiol monomethacrylate, isomyristyl monoacrylate, and isomyristyl monomethacrylate. Examples of the cyclic alkane having one (meth)acryloyl group include isobonyl monoacrylate, isobonyl monomethacrylate, tricyclodecane monoacrylate, and tricyclodecane monomethacrylate.

As the reactive diluent, one or two or more of the above-mentioned compounds can be used as the main component, but the diluents mentioned later other than the above-mentioned compounds can also be conveniently used.

Subsequently, the photo-curable composition constituting the photo-curable transfer sheet (8) is explained. The photo-curable transfer sheet of the invention has a the photo-curable transfer layer comprising a photo-curable composition is mainly composed of a reactive polymer having a photopolymerizable functional group and further phosphoric (meth)acrylate in the amount of 10 to 220 ppm.

The photo-curable composition is generally composed mainly of a reactive polymer having a photopolymerizable functional group (generally having a glass transition temperature of not more than 20° C.), the phosphoric (meth)acrylate to enhance adhesion to metal, a reactive diluent (e.g., monomer or oligomer) having a photopolymerizable functional group (preferably (meth)acryloyl group), acrylic resin, a photopolymerization initiator, antioxidant and if necessary other additives.

As the reactive polymer having photopolymerizable functional group, those described in the photo-curable transfer sheets (2) and (3) can be used.

The phosphoric (meth)acrylate can be any of (meth)acrylates having phosphoric ester bone, for example, monoester, diester or triester of phosphoric acid.

As the phosphoric acid (meth)acrylate or derivatives thereof, compounds of the following formula can be preferably employed.

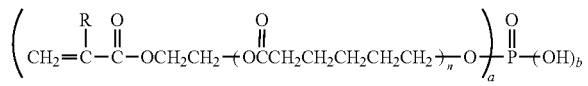

in which R represents H or $CH_3$, n is in the range of 0 to 2.0, a is in the range of 1.0 to 3.0, b is in the range of 0 to 2.0, and the sum of a and b is 3.0. In the formula, preferred is a mixture of the compounds that R represents $CH_3$, a is 1.5 (mean value), b is 1.5 (mean value), and n is 0.

The phosphoric (meth)acrylate can be other (meth)acrylates having phosphoric ester bone other than the above-mentioned compounds, for example, monoester, diester or triester of phosphoric acid. Examples of the phosphoric (meth)acrylate include ethylene oxide-modified phenoxylated phosphoric (meth)acrylate, ethylene oxide-modified butoxylated phosphoric (meth)acrylate, ethylene oxide-modified octyloxylated phosphoric (meth)acrylate, ethylene oxide-modified phosphoric di(meth)acrylate, ethylene oxide-modified phosphoric tri(meth)acrylate. The phosphoric (meth)acrylate can be used in one kind, or by mixing two or more kinds in appropriate ratio.

If the phosphoric (meth)acrylate (phosphoric (meth)acrylate and/or its derivative) is used in the amount of less than 10ppm based on the whole composition, the cured transfer layer is not sufficiently bonded to a layer of silver layer and the like. If the phosphoric (meth)acrylate is used in the amount of not less than 360 ppm, the cured transfer layer is extremely reduced in resistance to corrosion. In case the phosphoric (meth)acrylate is used in the amount of 10 to 220 ppm, the reflectivity is scarcely reduced under the conditions of high temperature and humidity and shows excellent adhesion to the layer of silver alloy. Especially the amount of 10 to 100 ppm balances the reflectivity and the adhesion.

The photo-curable composition of the invention preferably contains the reactive diluent (e.g., monomer or oligomer) having a photopolymerizable functional group as described in the photo-curable transfer sheets (1) to (8).

Examples of the reactive diluent (compound) having a photopolymerizable group include (meth)acrylate monomers such as 2-hydroxyethyl (meth)acrylate, 2-hydroxyropyl (meth)acrylate, 4-hydroxybutyl (meth)acrylate, 2-ethylhexylpolyethoxy (meth)acrylate, benzyl (meth)acrylate, isobornyl (meth)acrylate, phenyloxyethyl (meth)acrylate, tricyclodecane mono(meth)acrylate, dicyclopentenyloxyethyl (meth)acrylate, tetrahydrofurfuryl (meth)acrylate, acryloylmorpholine, N-vinylcaprolactam, 2-hydroxy-3-phenyloxypropyl (meth)acrylate, o-phenylphenyloxyethyl (meth)acrylate, neopentylglycol di(meth)acrylate, neopentyl glycol dipropoxy di(meth)acrylate, neopentyl glycol hydroxypivalate di(meth)acrylate, tricyclodecanedimethylol di(meth)acrylate, 1,6-hexanediol di(meth)acrylate, nonanediol di(meth) acrylate, trimethylolpropane tri(meth)acrylate, pentaerythritol tri(meth)acrylate, pentaerythritol tetra(meth)acrylate, tris [(meth)acryloxyethyl]isocyanurate and ditrimethylolpropane tetra(meth)acrylate; and the following (meth)acrylate oligomer such as:

polyurethane (meth)acrylate such as compounds obtained by reaction of:

a polyol compound (e.g., polyol such as ethylene glycol, propylene glycol, neopentyl glycol, 1,6-hexanediol, 3-methyl-1,5-pentanediol, 1,9-nonanediol, 2-ethyl-2-butyl- 1,3-propanediol, trimethylolpropane, diethylene glycol, dipropylene glycol, polypropylene glycol, 1,4-dimethylolcyclohexane, bisphenol-A polyethoxydiol and polytetramethylene glycol; polyesterpolyol obtained by reaction of the above-mentioned polyol and polybasic acid or anhydride thereof such as succinic acid, maleic acid, itaconic acid, adipic acid, hydrogenated dimer acid, phthalic acid, isophthalic acid and terephthalic acid; polycaprolactone polyol obtained by reaction of the above-mentioned polyol and ε-caprolactone; a compound obtained by reaction of the above-mentioned polyol and a reaction product of the above-mentioned polybasic acid or anhydride thereof and ε-caprolactone; polycarbonate polyol; or polymer polyol), and an organic polyisocyanate compound (e.g., tolylene diisocyanate, isophorone diisocyanate, xylylene diisocyanate, diphenylmethane-4,4'-diisocyanate, dicyclopentanyl diisocyanate, hexamethylene diisocyanate, 2,4,4'-trimethylhexamethylene diisocyanate, 2,2', 4'-trimethylhexamethylene diisocyanate), and hydroxyl-containing (meth)acrylate (e.g., 2-hydroxyethyl (meth)acrylate, 2-hydroxyropyl (meth)acrylate, 4-hydroxybutyl (meth)acrylate, 2-hydroxy-3-phenyloxypropyl (meth) acrylate, cyclohexane-1,4-dimethylolmono(meth)acrylate, pentaerythritol tri(meth)acrylate or glycerol di(meth)acrylate);

bisphenol-type epoxy(meth)acrylate obtained by reaction of bisphenol-A epoxy resin or bisphenol-F epoxy resin and (meth)acrylic acid.

These compounds having photopolymerizable functional group can be employed singly or in combination of two or more kinds.

Any photopolymerization initiators known can be used in the invention. The initiators having good storage-stability after mixing with other components are preferred. Examples of the photopolymerization initiators include acetophenone type initiators; benzoin type initiators such as benzylmethylketal; benzophenone type initiators; thioxanthone type initiators such as isopropylthioxanthone and 2,4-diethythioxanthone. Further, as special type, there can be mentioned methylphenylglyoxylate. Especially preferred are 2-hidroxy-2-methyl-1-phenylpropane-1-on, 1-hydroxycyclohexylphenylketone, 2-methyl-1-[4-(methylthio)phenyl]-2-morphorinopropane-1-on and benzophenone. These photopolymerization initiators can be employed together with one or more kinds of a photopolymerization promoter such as a benzoic acid type compound (e.g., 4-dimethylaminobezoic acid) or a tertiary amine compound by mixing the initiator with the promoter in optional ratio.

The initiator can be employed singly or in combination of two or more kinds. The initiator is preferably contained in the photo-curable composition in the range of 0.1 to 20% by weight, especially 1 to 10% by weight.

In addition to the above-mentioned photopolymerizable initiators, the acetophenone type initiator includes 4-phenoxydichloroacetophenone, 4-t-butyldichloroacetophenone, 4-t-butyltrichloroacetophenone, diethoxyacetophenone, 2-hidroxy-2-methyl-1-phenylpropane-1-on, 1-(4-isopropylphenyl)-2-hidroxy-2-methylpropane-1-on, 1-(4-dodecylphenyl)-2-hydroxy-2-methylpropane-1-on, 4-(2-hydroxyethoxy)-phenyl(2-hydroxy-2-propyl)ketone, 1-hydroxycyclohexylphenylketone, 2-methyl-1-[4-(methylthio)phenyl]-2-morphorino-propane-1-on; and the benzophenone type initiators include benzophenone, benzoylbenzoic acid, methyl benzoylbenzoate, 4-phenylbenzophenone, hydroxybenzophenone, 4-benzoyl-4'-methylphenylsulfide and 3,3'-dimethyl-4-methoxybenzophenone.

The acetophenone type initiators preferably are 2-hidroxy-2-methyl-1-phenylpropane-1-on, 1-hydroxycyclohexylphenylketone and 2-methyl-1-[4-(methylthio)phenyl]-2-morphorinopropane-1-on, and the benzophenone type initiators preferably are benzophenone, benzoylbenzoic acid and methyl benzoylbenzoate.

Preferred examples of the tertiary amine compounds of the photopolymerization promoter include triethanolamine, methyldiethanolamine, triisopropanolamine, 4,4'-dimethylaminobenzophenone, 4,4'-diethylaminobenzophenone, ethyl 2-dimethylaminobenzoate, ethyl 4-dimethylaminobenzonate, (n-butoxy)ethyl 4-dimethylaminobenzonate, isoamyl 4-dimethylaminobenzonate and 2-ethylhexyl 4-dimethylaminobenzonate. Especially preferred are ethyl 4-dimethylaminobenzonate, (n-butoxy)ethyl 4-dimethylaminobenzonate, isoamyl 4-dimethylaminobenzonate and 2-ethylhexyl 4-dimethylaminobenzonate.

The photo-curable composition of the invention is preferably configured such that the photo-curable transfer sheet has a glass transition temperature of not more than 20° C. and a transmittance of not less than 70%. Therefore the photo-curable composition preferably contains, in addition to the reactive diluent having a photopolymerizable functional group and the photopolymerization initiator, if desired the following thermoplastic resin and other additives.

The ratio by weight of the reactive polymer:the compound having a photopolymerizable functional group:the photopolymerization initiator generally is 40-100:0-60:0.1-10, preferably 60-100:0-40:1-10.

As other additives, a silane coupling agent can be used for enhancing the adhesive strength (adhesion). Examples of the silane coupling agent include vinyltriethoxysilane, vinyltris (β-methoxyethoxy)silane, γ-methacryloxypropylmethoxysilane, vinyltriacetoxysilane, γ-glycidoxypropyltrimethoxysilane, γ-glycidoxypropyltriethoxysilane, β-(3,4-epoxycyclohexyl)ethyltrimethoxysilane, γ-chloropropylmethoxysilane, vinyltrichlorosilane, γ-mercaptopropylmethoxysilane, γ-aminopropyltriethoxysilane, N-β-(aminoethyl)-γ-aminopropyltrimethoxysilane. The silane. coupling agent can be used singly, or in combination of two or more kinds. The silane coupling agent is preferably used in the range of 0.01 to 5 weight by part based on 100 parts by weight of the above reactive polymer.

Similarly, an epoxy group-containing compound can be used for enhancing the adhesive strength. Examples of the epoxy group-containing compounds include triglycidyl tris (2-hydroxyethyl)isocyanurate, neopentylglycol diglycidyl ether, 1,6-hexanediol diglycidyl ether, allyl glycidyl ether, 2-ethylhexyl glycidyl ether, phenyl glycidyl ether, phenol glycidyl ether, p-tert-butylphenyl glycidyl ether, diglycidyl adipate, diglycidyl o-phthalate, glycidyl methacrylate and butyl glycidyl ether. Further, the similar effect is also obtained by using an oligomer having an epoxy group and molecular weight of hundreds to thousands, or a polymer having an epoxy group and molecular weight of thousands to hundreds of thousands. The content of the compound having an epoxy group is sufficient in the range of 0.1 to 20 parts by weight based on 100 parts by weight of the reactive polymer. At least one of the compounds having an epoxy group can be used singly or in combination of two or more kinds.

As other additives, further a hydrocarbon resin can be used for improving processing properties such as laminating properties. The hydrocarbon resin may be either natural resin or synthetic resin. Examples of the natural resins preferably include rosins, rosin derivatives and terpene resins. Examples of the rosins include gum resins, tall oil resins, wood resins. Examples of the rosin derivatives include hydrogenated rosins, disproportionated rosins, polymerized rosins, esterificated rosins, metal salts of rosins. Examples of the terpene resins include α-pinene resins, β-pinene resins, and terpene phenol resins. Moreover, as the natural resin, dammar, copal, shellac can be used. Examples of the synthetic resins preferably include petroleum resins, phenol resins, and xylene resins. Examples of the petroleum resins include aliphatic petroleum resins, aromatic petroleum resins, cycoaliphatic petroleum resins, copolymer type petroleum resins, hydrogenated petroleum resins, pure monomer type petroleum resins, and coumarone-indene resins. Examples of the phenol resins include alkylphenol resins and modified phenol resins. Examples of the xylene resins include xylene resins and modified xylene resins.

Furthermore, acrylic resin can be employed in the invention. For example, homopolymers and copolymers obtained from alkyl acrylate(s) such as methyl acrylate, ethyl acrylate and butyl acrylate and/or alkyl methacrylate(s) such as methyl methacrylate, ethyl methacrylate and butyl methacrylate can be used. Copolymers of these monomers and other copolymerizable monomers can be also used. In view of reactivity in the photo curing step, and durability and transparency of cured product, polymethyl methacrylate (PMMA) is preferred.

The above-mentioned polymer such as hydrocarbon resin can be used in the amount of 1 to 20 parts by weight, preferably 5 to 15 parts by weight based on 100 parts by weight of the reactive polymer.

The photo-curable composition may contain, in addition to the above-mentioned additives, an ultraviolet absorber, an aging resistant agent, a dye, and a processing auxiliary agent in a small amount. If desired, particles of silica gel, calcium carbonate or silicone copolymer may be contained in a small amount.

The photo-curable transfer sheet comprising the photo-curable composition of the invention is generally prepared by homogeneously mixing the reactive polymer, the compound diluent) having a photopolymerizable functional group (monomer and oligomer) and if desired, the compound having at least two functional groups having active hydrogen and other additives, kneading the mixture using an extruder or roll, and subjecting the kneaded mixture to a film-forming process using a calendar, roll, T-die extrusion or inflation to form a film of a predetermined dimension. When a support is used, it is necessary to form a film on the support. A more preferred process for forming the photo-curable sheet comprises the steps of: dissolving homogeneously the components in a good solvent, applying the resultant solution onto a separator coated closely with silicone or fluoric resin (or the support) by means of flow-coater method, roll-coater method, gravure-roll method, mayer-bar method or lip-die coating method, and vaporizing the solvent.

The thickness of the photo-curable transfer layer generally is in the range of 1 to 1,200 μm, preferably 5 to 500 μm, especially 5 to 300 μm (preferably not more than 150 μm). When the thickness is thinner than 1 μm, sealing properties are lowered and maybe the layer does not full up the unevenness of the transparent substrate. When the thickness is thicker than 1,200 μm, the thickness of the resultant recording medium is so thick that trouble in housing or assembly of the medium or reverse influence in light transmittance possibly occurs.

The photo-curable transfer layer preferably has a release sheet on its both sides.

The release sheet preferably comprises transparent organic resin having a glass transition temperature of not less than 50° C. The release sheet generally is a transparent resin sheet mainly consisting of organic resin such as polyester resin (e.g., polyethylene terephthalate, polycyclohexylene terephthalate, polyethylene naphthalate), polyamide (e.g., nylon 46, modified nylon 6T, nylon MXD6, polyphthalamide), ketone resin (e.g., polyphenylene sulfide, polythioether sulfone), sulfone resin (e.g., polysulfone, polyether sulfone), polyether nitrile, polyarylate, polyether imide, polyamideimide, polycarbonate, polymethyl methacrylate, triacetylcellulose, polystyrene or polyvinyl chloride. Of these resins, polycarbonate, polymethyl methacrylate, polyvinyl chloride, polystyrene and polyethylene terephthalate can be preferably employed. The thickness is generally in the range of 10 to 200 μm, especially in the range of 30 to 100 μm.

The substrate 21 having uneven surface used in the invention preferably comprises transparent organic resin having a glass transition temperature of not less than 50° C. The substrate generally is a transparent resin sheet mainly consisting of organic resin such as polyester resin (e.g., polyethylene terephthalate, polycyclohexylene terephthalate, polyethylene naphthalate), polyamide (e.g., nylon 46, modified nylon 6T, nylon MXD6, polyphthalamide), ketone resin (e.g., polyphenylene sulfide, polythioether sulfone), sulfone resin (e.g., polysulfone, polyether sulfone), polyether nitrile, polyarylate, polyether imide, polyamideimide, polycarbonate, polymethyl methacrylate, triacetylcellulose, polystyrene or polyvinyl chloride. Of these resins, polycarbonate, polymethyl methacrylate, polyvinyl chloride, polystyrene and polyethylene terephthalate are excellent in transferring properties, transparency and birefringence, and therefore can be preferably employed. The thickness is generally in the range of 200 to 2,000 μm, especially in the range of 500 to 1,500 μm.

The polymer film 26 for protection used in the invention preferably comprises transparent organic resin having a glass transition temperature of not less than 50° C. The film generally is a transparent resin sheet mainly consisting of organic resin such as polyester resin (e.g., polyethylene terephthalate, polycyclohexylene terephthalate, polyethylene naphthalate), polyamide (e.g., nylon 46, modified nylon 6T, nylon MXD6, polyphthalamide), ketone resin (e.g., polyphenylene sulfide, polythioether sulfone), sulfone resin (e.g., polysulfone, polyether sulfone), polyether nitrile, polyarylate, polyether imide, polyamideimide, polycarbonate, polymethyl methacrylate, triacetylcellulose, polystyrene or polyvinyl chloride. Of these resins, polycarbonate, polymethyl methacrylate, polyvinyl chloride, polystyrene and polyethylene terephthalate are excellent in transparency and birefringence, and therefore can be preferably employed. The thickness is generally in the range of 10 to 200 μm, especially in the range of 50 to 100 μm.

Though the photo-curable transfer sheet of the invention obtained as above generally comprises the photo-curable composition containing the reactive polymer of a glass transition temperature of not more than 20° C., the photo-curable transfer sheet generally has a light transmittance of not less than 70% in a wavelength rang of 380 to 420 nm, preferably 380 to 800 nm. In more detail, by setting the glass transition temperature of the reactive polymer to not more than 20° C., the resultant photo-curable sheet has such flexibility as can follow exactly the uneven surface of the stamper even at room temperature when the sheet is depressed on the stamper. Especially, in the case of the glass transition temperature of 15 to −50° C., the properties following exactly the uneven surface of the stamper is further improved. When the glass transition temperature is so high, high pressure and temperature is needed in the depressing or bonding operation whereby the workability is reduced. When the glass transition temperature is so low, the resultant sheet after curing does not have sufficient hardness.

As described above, the (cured) photo-curable transfer sheet generally has a light transmittance of not less than 70% in a wavelength rang of 380 to 420 nm, preferably 380 to 800 nm, whereby reduction of the strength of signals to be read out with a laser beam can be prevented. Further, the sheet preferably has a light transmittance of not less than 80% in a wavelength rang of 380 to 420 nm.

The reactive polymer of the photo-curable composition preferably has 1 to 50% by mole of polymerizable functional group, whereby the cured photo-curable sheet has strength for maintaining its shape. The photopolymerization initiator is preferably used in the amount of 0.1 to 10% by weight as described previously. The amount of less than the lower limit causes workability to reduce owing to slow curing rate, whereas the amount of more than the upper limit deteriorates the properties following exactly the uneven or rough surface of the stamper.

The photo-curable transfer sheet of the invention can be obtained as a film precisely controlled in the thickness, and therefore it is possible to easily and precisely bond the sheet to the uneven surface such as the substrate or stamper. This bonding (contact bonding) can be easily carried out by depressing the sheet and stamper by means of easy method using pressure rollers or easy press to temporarily bond them at temperature of 20 to 100° C., and then curing the sheet by exposing it to light at room temperature for one to tens seconds. Further, the temporarily bonded laminate is free from occurrence of slippage or peeling between of the sheet and stamper or substrate owing to its specific adhesion, and hence the laminate can be freely handled until the light-curing step.

In case the photo-curable transfer sheet of the invention is cured, it is possible to adopt, as light source used, various sources generating light in the wavelength range of ultraviolet to visible rays. Examples of the sources include super-high-pressure, high-pressure and low-pressure mercury lamps, a chemical lamp, a xenon lamp, a halogen lamp, a mercury halogen lamp, a carbon arc lamp, and an incandescent electric lamp, and laser beam. The exposing time is generally in the range of a few seconds to a few minutes, depending upon kinds of the lamp and strength of light. To promote the curing, the laminate may be heated beforehand for 30 to 80° C., and then the heated laminate may be exposed to ultraviolet rays.

The reflective layer of the invention is formed on an uneven surface of the resultant cured photo-curable sheet having the uneven surface by metallizing (e.g., spattering, vacuum deposition, ion-plating). Examples of the metal materials include aluminum, gold, silver or alloys thereof. The semitransparent reflective layer provided on the sheet is generally formed by using silver or the like as metal. In more detail, the semitransparent reflective layer is required to have low reflectivity compared with the reflective layer, and therefore is formed by changing the materials and/or the thickness.

When the organic polymer film is bonded onto the reflective layer of the cured sheet, an adhesive is applied onto one of the film and the sheet, and the other is superposed on the adhesive layer to be cured. When the adhesive is UV-curable resin, it is cured by UV irradiation, and when the adhesive is hot-melt type, it is applied to the reflective layer under heating and then cooled.

In the preparation of the optical information recording medium of the invention, it is continuously processed in the form of disc. However, it may be processed in the form of sheet and finally punched out in the form of disc.

EXAMPLE

The invention is illustrated in detail using the following Examples.

Example 1

<Preparation of Photo-Curable Transfer Sheet>
(Preparation of Reactive Polymer)

| Formulation I | |
|---|---|
| 2-ethylhexyl methacrylate | 70 parts by weight |
| methyl methacrylate | 20 parts by weight |
| 2-hydroxyethyl methacrylate | 10 parts by weight |
| benzophenone | 5 parts by weight |
| toluene | 30 parts by weight |
| ethyl acetate | 30 parts by weight |

A mixture of the above Formulation I was heated to 60° C. with moderately stirring to initiate the polymerization, and stirred at this temperature for 10 hours to provide acrylic resin having a hydroxyl group on its side chain. Then, 5 parts by weight of Calens MOI (2-isocyanatoethyl methacrylate; available from Showa Denko K.K.) was added to the solution of the acrylic resin, and reacted with each other in an atmosphere of nitrogen at 50° C. with moderately stirring to provide a solution 1 containing a reactive polymer having a photopolymerizable functional group.

The resultant reactive polymer has Tg of 0° C. and 5% by mole of methacryloyl group and 5% by mole of hydroxyl group on its side.

| Formulation II | |
|---|---|
| solution 1 of reactive polymer | 100 parts by weight |
| hexanediol dimethacrylate | 30 parts by weight |
| diisocyanate | 0.5 part by weight |
| (BXX5627, available from Toyo Ink Mfg.) | |
| Irgercure 184 (available from Chiba-Geigy) | 1 part by weight |

The above Formulation II was homogeneously dissolved to give a mixture, which was applied onto a whole surface of a release sheet (width: 140 mm, length: 300 m, thickness: 75 μm; trade name: No. 23, available from Fujimori Kogyo) and dried to form a photo-curable transfer layer of thickness of 20±2 μm. Subsequently, the release sheet that is same as above is applied to the opposite side of the photo-curable transfer layer to be rolled up in the form of roll. Thus, a full-edge type roll of photo-curable transfer sheet of diameter of 260 mm was prepared.

Example 2

Example 1 was repeated except for using the diisocyanate of Formulation II in the amount of 1.0 part by weight to prepare a full-edge type roll of photo-curable transfer sheet.

Example 3

Example 1 was repeated except for using the diisocyanate of Formulation II in the amount of 0.1 part by weight to prepare a full-edge type roll of photo-curable transfer sheet.

Example 4

Example 1 was repeated except for using the diisocyanate of Formulation II in the amount of 3.0 part by weight to prepare a full-edge type roll of photo-curable transfer sheet.

Comparison Example 1

Example 1 was repeated except for not using the diisocyanate of Formulation II to prepare a full-edge type roll of photo-curable transfer sheet.

(1) Evaluation of Photo-Curable Transfer Sheet (1-1) Creep Test of Transfer Sheet The rolls obtained in Examples 1 to 4 and Comparison Example 1 are allowed to stand at 25° C. for 24 hours, and then the transfer layers of the sheets of the rolls are subjected to a creep test using RheoStress RS300 (available from HAAKE) as a dynamic viscoelasticity measuring apparatus. The test is carried out using a parallel plate of $\phi=20$ mm under the conditions of a thickness to be measured of 1 mm (obtained by superposing and forming the transfer layers), a measuring temperature of 25° C., a stress of 50 Pa and a stress application time of 120 seconds.

Figure 7:
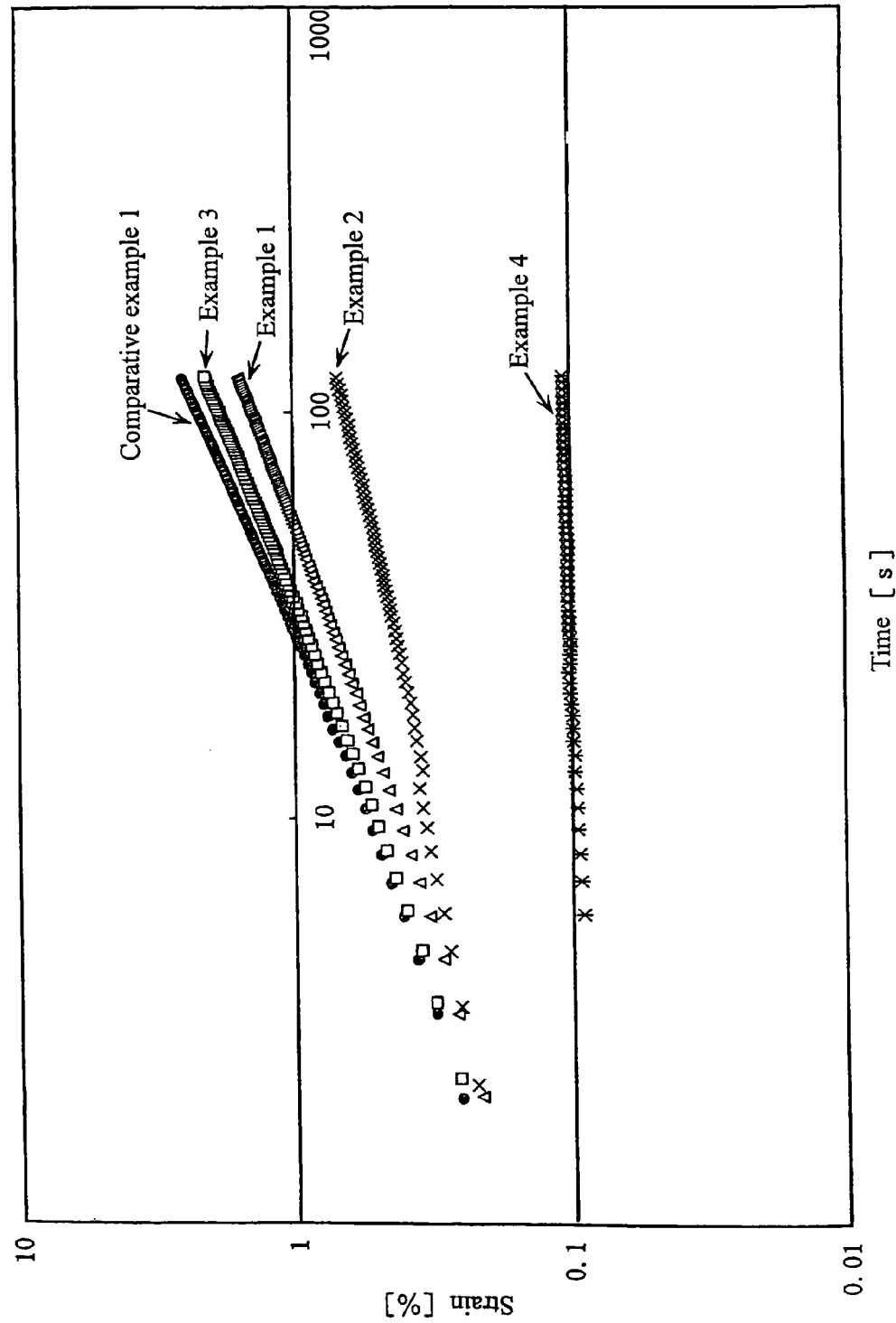
FIG. 7 is a graph obtained by plotting strain [γ] (%) against time [t] (second) in Example.
Figure 8:
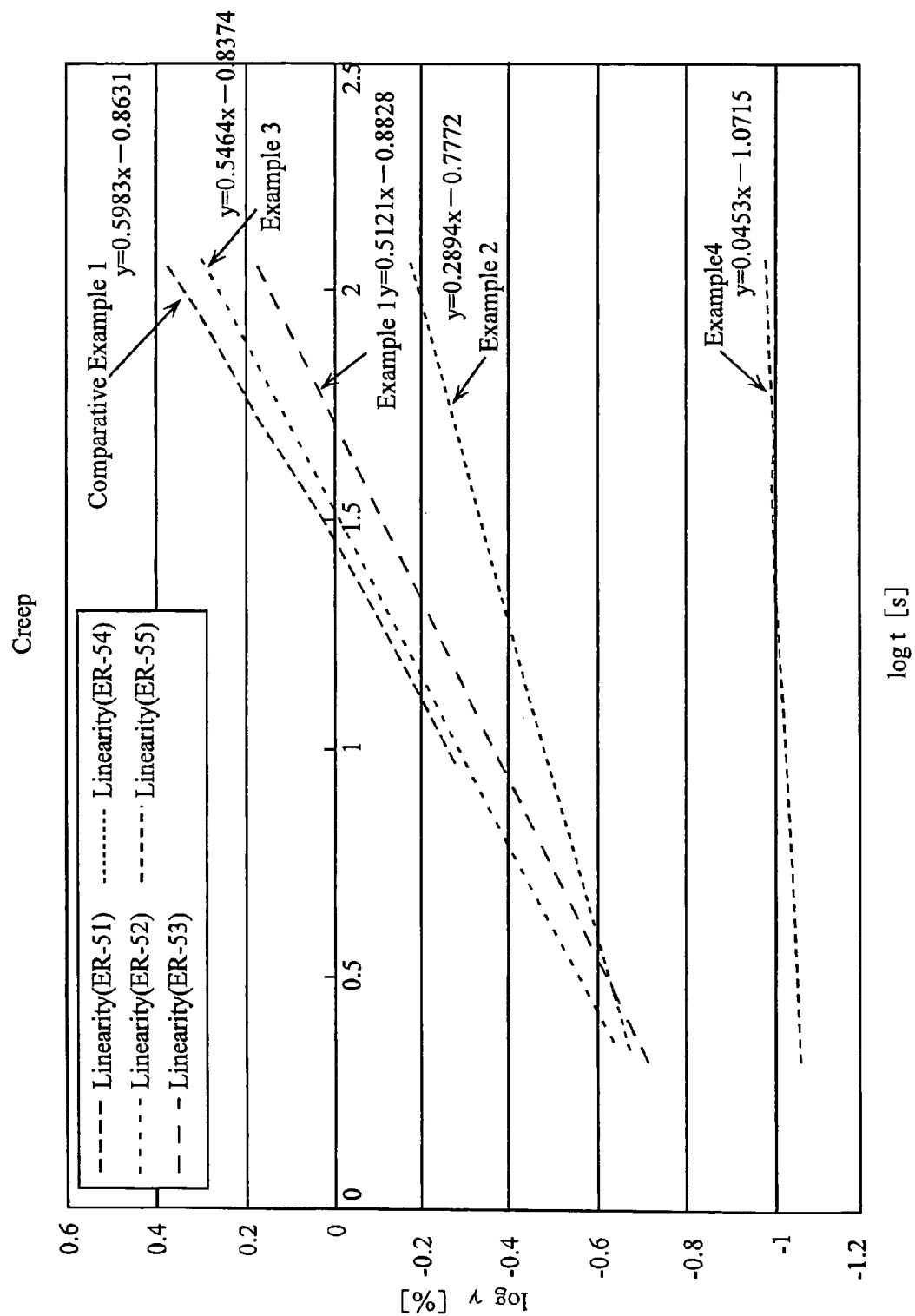
FIG. 8 is a graph showing the relationship between log γ and log t based on the graph of FIG. 7.
Figure 9:
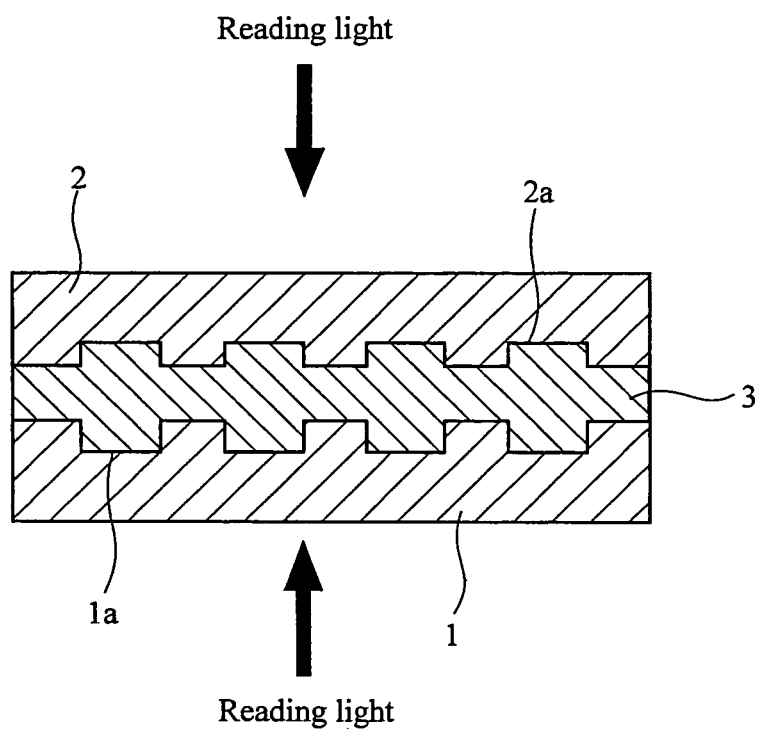
FIG. 9 is a section view showing an example of a conventional optical information recording medium.
Figure 10:
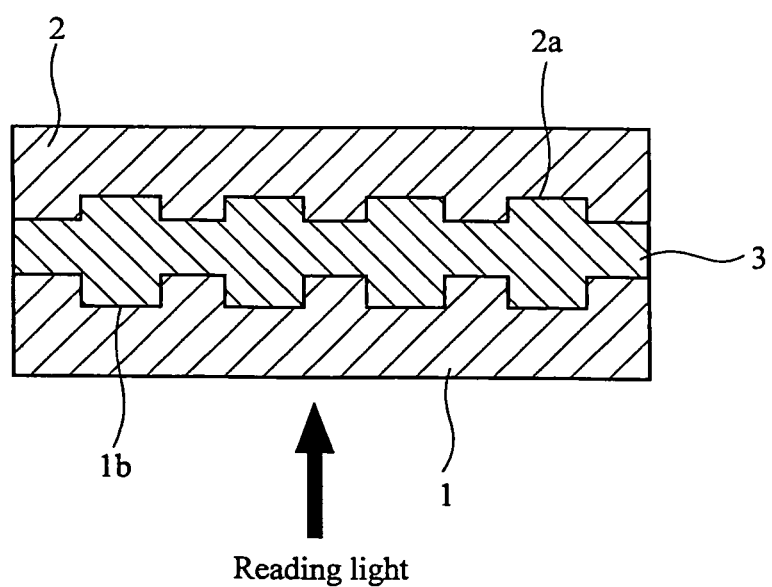
FIG. 10 is a section view showing another example of a conventional optical information recording medium.
Figure 11:
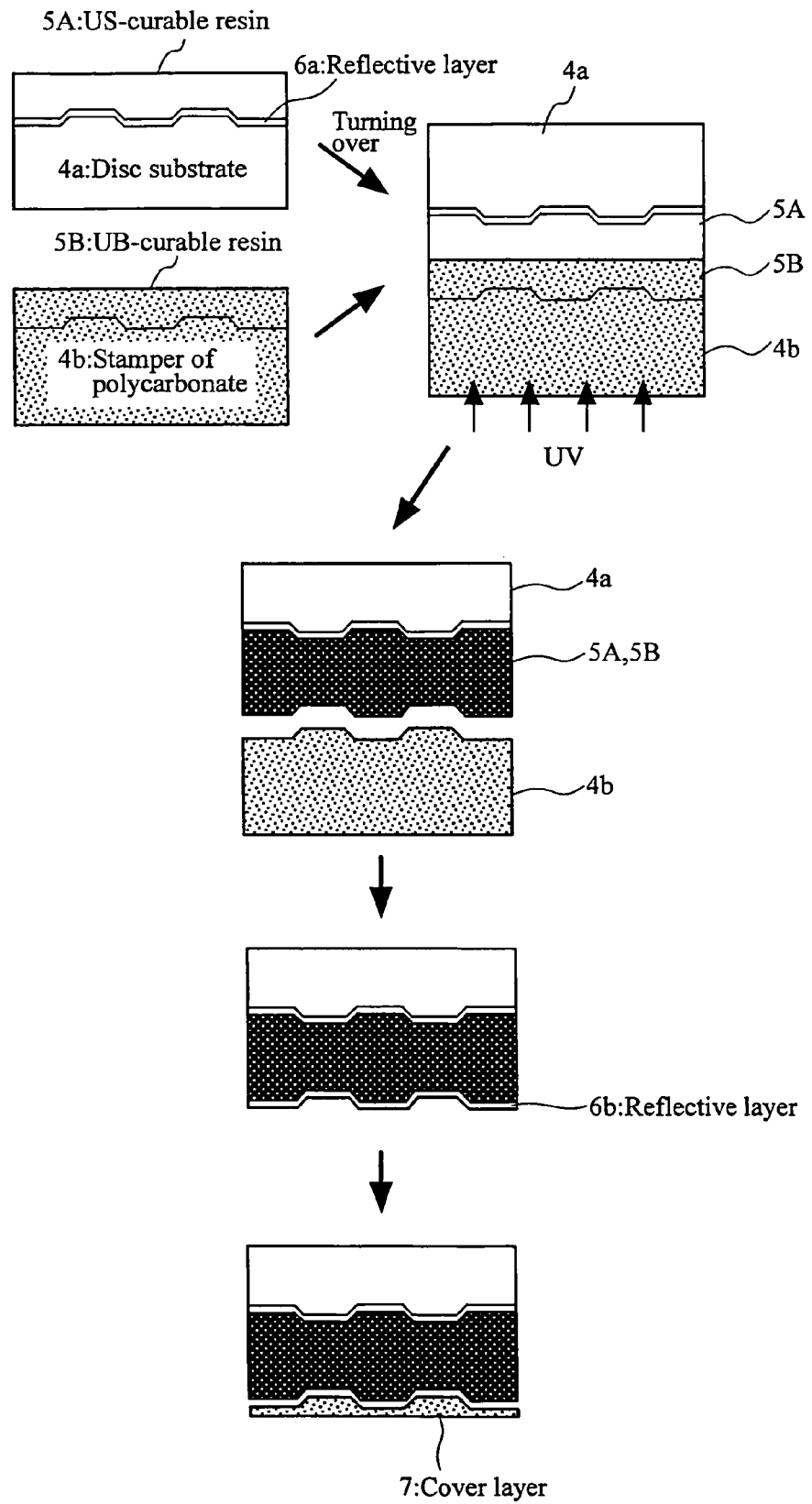
FIG. 11 is a section view showing the procedure for a process for the preparation of an optical information recording medium described in NIKKEI ELECTRONICS.

By using the obtained data, plot of strain [γ] (%) against time [t] (second) forms a graph of FIG. 7. A graph showing the relationship between log γ and log t prepared based on the graph of FIG. 7 is shown in FIG. 8. The "a" and "b" of the formula "a log γ=a+b·log t" in each of the Examples 1 to 4 and Comparison Example 1 are determined from the graph of FIG. 8.

(1-2) Bleeding

The rolls obtained in Examples 1 to 4 and Comparison Example 1 are allowed to stand at ordinary temperature for 24 hours, and then bleeding of the transfer layer of each of the rolls is observed. The appearance of the bleeding is evaluated as follows:

| | |
|---|---|
| ○: | Bleeding is not observed; |
| Δ: | Bleeding is slightly observed; |
| x: | Bleeding is significantly observed. |

(1-3) Hardness of Surface of Transfer Sheet

The transfer layer (thickness: 25 μm) obtained in each of Examples 1 to 4 and Comparison Example 1 are transferred onto a glass plate to prepare a sample. HU (Universal Hardness; surface hardness) of the sample is measured using an ultramicro hardness-testing machine (Fisher Scope H100, available from Helmut Fisher) under the condition of load of 4.0 mN. The Universal Hardness is described in, for example, "Material Testing Technology", vol. 43, No. 2, pp. 148 (May, 1998).

(1-4) Accuracy of Thickness

The thickness of the obtained photo-curable transfer sheet is measured at 10 points per 1 m² of the sheet. Variation of the values of the thicknesses is determined.

| | |
|---|---|
| ○: | Variation of not more than 5%; |
| x: | Variation of more than 5%. |

(2) Evaluation of Optical Information Recording Medium

<Preparation of Optical Information Recording Medium>

After the photo-curable transfer sheet was punched out in the form of disc, the resultant disc-shaped photo-curable transfer sheet was placed on a semi-transparent reflective layer of silver alloy formed on an uneven surface of a polycarbonate substrate (thickness: 1.1 mm) having the uneven surface as pits formed by injection molding such that the surface of the transfer sheet was in contact with the reflective layer, and depressed using a roller made of silicone rubber under load of 2 kg to form a laminate (corresponding to (3) of FIG. 2).

Subsequently, the other release sheet of the transfer sheet of the laminate was removed, and an uneven surface of a nickel stamper having the uneven surface as pits was placed on the exposed surface of the transfer sheet such that the uneven surface was in contact with the exposed surface, and the stamper was depressed using a roller made of silicone rubber under load of 2 kg to form a laminate, whereby the uneven surface of the stamper was transferred to the exposed surface of the transfer sheet.

Subsequently, the photo-curable transfer sheet of the laminate was exposed to UV-rays under the condition of an integrated amount of light of 1,000 mJ/cm² using a metal halide lamp and as a result, the transfer sheet (transfer layer) was cured.

The stamper was peeled from the laminate. Aluminum was spattered on the uneven surface of the cured photo-curable transfer sheet to form an aluminum reflective layer (70 nm). A polycarbonate film (thickness: 70 μm; Pure Ace C110-70, available from Teijin Ltd.) was bonded onto the semi-transparent reflective layer through an adhesion.

Thus, an optical information recording medium having two layers provided with uneven surface was prepared.

<Evaluation of Optical Information Recording Medium>

(2-1) Light Transmittance (Wavelength of 380 to 420 nm)

Light transmittance of one optical information recording substrate is measured in the wavelength of 380 to 420 nm according to JIS K6717. Light transmittance of 70% or more is marked as ○, and Light transmittance of less than 70% is marked as x.

(2-2) Transferring Property (Readout of Signals)

The information of the resultant optical information recording medium is read out using a laser beam of wavelength of 405 nm to obtain its wavy pattern. This wavy pattern is compared with that of the stamper. The wavy pattern of the medium coincident with that of the stamper is marked as ○, and the wavy pattern of the medium little coincident with that of the stamper is marked as x.

The obtained results are shown in Table 1.

TABLE 1

| | Example 1 | Example 2 | Example 3 | Example 4 | Co. Ex. 1 |
|---|---|---|---|---|---|
| Diisocyanate (weight part) | 0.5 | 1.0 | 0.1 | 3.0 | 0.0 |
| b | 0.51 | 0.29 | 0.55 | 0.05 | 0.60 |
| Bleeding | ○ | ○ | Δ | ○ | x |
| Surface hardness (N/mm²) | 0.2 | 0.2 | 0.2 | 0.2 | 0.2 |
| Accuracy of thickness | ○ | ○ | Δ | ○ | x |
| Light transmittance (380-420 nm) | ○ | ○ | ○ | ○ | ○ |
| Transfer Property | ○ | ○ | ○ | Δ | ○ |

The photo-curable transfer sheets in the form of roll obtained in Examples 1 to 4 and Comparison Example 1 scarcely show bleeding, and the shape of pits of the optical information recording media prepared using the sheets are good. Further the transfer sheets show excellent transferring property and workability. Especially, the sheets obtained in Examples 1 and 2 are extremely excellent in the above properties. The photo-curable transfer sheets obtained in Comparison Example 1 shows good shape of pits, but shows occurrence of bleeding of the roll and therefore reduces workability. Hence, the photo-curable transfer sheets of the invention are enhanced in the workability without reduction of the characteristics of the optical information recording medium.

Example 5

<Preparation of Photo-Curable Transfer Sheet>
(Preparation of Reactive Polymer)

| Formulation I | |
|---|---|
| 2-ethylhexyl methacrylate | 70 parts by weight |
| methyl methacrylate | 20 parts by weight |
| 2-hydroxyethyl methacrylate | 10 parts by weight |
| benzophenone | 5 parts by weight |
| toluene | 30 parts by weight |
| ethyl acetate | 30 parts by weight |

A mixture of the above Formulation I was heated to 60° C. with moderately stirring to initiate the polymerization, and stirred at this temperature for 10 hours to provide acrylic resin having a hydroxyl group on its side chain. Then, 5 parts by weight of Calens MOI (2-isocyanatoethyl methacrylate; available from Showa Denko K.K.) was added to the solution of the acrylic resin, and reacted with each other in an atmosphere of nitrogen at 50° C. with moderately stirring to provide a solution 1 containing a reactive polymer having a photopolymerizable functional group.

The resultant reactive polymer has Tg of 0° C. and 5% by mole of methacryloyl group.

| Formulation II | |
|---|---|
| solution 1 of reactive polymer | 100 parts by weight |
| tricyclodecane diacrylate | 30 parts by weight |
| tackifier | 10 parts by weight |
| (SP value = 8.52, mp = 115° C., Tg = 59° C., mean molecular weight = 650, Clyaron M115, available from Yasuhara Chemical) | |
| 1-hydroxycyclohexyl phenyl ketone | 1 part by weight |

The above Formulation II was homogeneously dissolved to give a mixture, which was applied onto a whole surface of a release sheet (width: 140 mm, length: 200 m, thickness: 75 µm; trade name: No. 23, available from Fujimori Kogyo) and dried to form a photo-curable transfer layer of thickness of 20±2 µm. Subsequently, the release sheet that is same as above was applied to the opposite side of the photo-curable transfer layer to be rolled up in the form of roll. Thus, a full-edge type roll of photo-curable transfer sheet (diameter: 0.25 m) was prepared.

Comparison Example 2

Example 5 was repeated except for not using the tackifier of Formulation II to prepare a full-edge type roll of photo-curable transfer sheet.

Comparison Example 3

Example 5 was repeated except for using another tackifier (SP value=8.26, mp=115° C., Tg=62° C., mean molecular weight=1,100, trade name: YS resin PX1150, available from Yasuhara Chemical) as tackifier of Formulation II to prepare a full-edge type roll of photo-curable transfer sheet.
(1) Evaluation of Photo-Curable Transfer Sheet
(1-1) Bleeding The rolls obtained in Example 5 and Comparison Examples 2 and 3 are allowed to stand at ordinary temperature for 24 hours, and then bleeding of the transfer layer of each of the rolls is observed. The appearance of the bleeding is evaluated as follows:

| ○: | Bleeding is not observed; |
|---|---|
| Δ: | Bleeding is slightly observed; |
| x: | Bleeding is significantly observed. |

(1-2) Accuracy of Thickness

The thickness of the obtained photo-curable transfer sheet is measured at 10 points per 1 m² of the sheet. Variation of the values of the thicknesses is determined.

| ○: | Variation of not more than 1%; |
|---|---|
| x: | Variation of more than 1%. |

(1-3) Creep Test of Transfer Sheet

The rolls obtained in Example 5 and Comparison Example 2 are allowed to stand at 25° C. for 24 hours, and then the transfer layers of the sheets of the rolls are subjected to a creep test using RheoStress RS300 (available from HAAKE) as a dynamic viscoelasticity measuring apparatus. The test is carried out using a parallel plate of φ=20 mm under the conditions of a thickness to be measured of 1 mm (obtained by superposing and forming the transfer layers), a measuring temperature of 25° C., a stress of 50 Pa and a stress application time of 120 seconds.

By using the obtained data, plot of strain [γ] (%) against time [t] (second) forms a graph showing the relationship between log γ and log t. The "b" of the formula "a log γ=a+ b·log t" in each of the Example 5 and Comparison Example 2 is obtained from the graph.
(2) Evaluation of Optical Information Recording Medium
<Preparation of Optical Information Recording Medium>

After the photo-curable transfer sheet was punched out in the form of disc, the resultant disc-shaped photo-curable transfer sheet was placed on a semi-transparent reflective layer of silver alloy formed on an uneven surface of a polycarbonate substrate (thickness: 1.1 mm) having the uneven surface as pits formed by injection molding such that the surface of the transfer sheet was in contact with the reflective layer, and depressed using a roller made of silicone rubber under load of 2 kg to form a laminate (corresponding to (3) of FIG. 2).

Subsequently, the other release sheet of the transfer sheet of the laminate was removed, and an uneven surface of a nickel stamper having the uneven surface as pits was placed on the exposed surface of the transfer sheet such that the uneven surface was in contact with the exposed surface, and the stamper was depressed using a roller made of silicone rubber under load of 2 kg to form a laminate, whereby the uneven surface of the stamper was transferred to the exposed surface of the transfer sheet.

Subsequently, the photo-curable transfer sheet of the laminate was exposed to UV-rays under the condition of an integrated amount of light of 1,000 mJ/cm² using a metal halide lamp and as a result, the transfer sheet (transfer layer) was cured.

The stamper was peeled from the laminate. Aluminum was spattered on the uneven surface of the cured photo-curable transfer sheet to form an aluminum reflective layer (70 nm). A polycarbonate film (thickness: 70 µm; Pure Ace C110-70, available from Teijin Ltd.) was bonded onto the semi-transparent reflective layer through an adhesion.

Thus, an optical information recording medium having two layers provided with uneven surface was prepared.

<Evaluation of Optical Information Recording Medium>
(2-1) Light Transmittance (Wavelength of 380 to 420 nm)

Light transmittance of one photo-curable transfer sheet is measured in the wavelength of 405 nm according to JIS K6717.

(2-2) Readout of Signals

The information of the resultant optical information recording medium is read out using a laser beam of wavelength of 405 nm to obtain its wavy pattern. This wavy pattern is compared with that of the stamper. The wavy pattern of the medium coincident with that of the stamper is marked as ○, and the wavy pattern of the medium little coincident with that of the stamper is marked as x.

The obtained results are shown in Table 2.

TABLE 2

|  | Example 5 | Co. Ex. 2 | Co. Ex. 3 |
| --- | --- | --- | --- |
| Bleeding | ○ | x | Δ |
| Accuracy of thickness | ○ | x | Δ |
| b | 0.50 | 0.59 | — |
| Light transmittance (405 nm) | 90% | 88% | 70% |
| Readout of signals | ○ | ○ | ○ |

The photo-curable transfer sheet obtained in Example 5 shows a small b value and no bleeding of the roll, and the shape of pits of the optical information recording medium prepared using the sheet are good. Further the transfer sheet shows excellent transferring property and workability. Furthermore the transfer sheet shows high transmittance, and is advantageous in passage of laser beam through the layer, and therefore the optical information recording medium has excellent characteristics.

The photo-curable transfer sheets containing no tackifier obtained in Comparison Example 2 shows a large b value and good shape of pits, but shows occurrence of bleeding of the roll and therefore reduced workability. Further the photo-curable transfer sheets containing tackifier less than the SP value of the invention (Comparison Example 3) shows good shape of pits, but shows occurrence of bleeding of the roll and therefore reduced workability, and further shows reduced transmittance.

Hence, the photo-curable transfer sheets of the invention are enhanced in the workability without reduction of the characteristics of the optical information recording medium.

Example 6

<Preparation of Photo-Curable Transfer Sheet>
(Preparation of Reactive Polymer)

| Formulation I | |
| --- | --- |
| 2-ethylhexyl methacrylate | 70 parts by weight |
| methyl methacrylate | 20 parts by weight |
| 2-hydroxyethyl methacrylate | 10 parts by weight |
| benzophenone | 5 parts by weight |
| toluene | 30 parts by weight |
| ethyl acetate | 30 parts by weight |

A mixture of the above Formulation I was heated to 60° C. with moderately stirring to initiate the polymerization, and stirred at this temperature for 10 hours to provide acrylic resin having a hydroxyl group on its side chain. Then, 5 parts by weight of Calens MOI (2-isocyanatoethyl methacrylate; available from Showa Denko K.K.) was added to the solution of the acrylic resin, and reacted with each other in an atmosphere of nitrogen at 50° C. with moderately stirring to provide a solution 1 containing a reactive polymer having a photopolymerizable functional group.

The resultant reactive polymer has Tg of 0° C. and 5% by mole of methacryloyl group.

| Formulation II | |
| --- | --- |
| solution 1 of reactive polymer | 100 parts by weight |
| tricyclodecane diacrylate | 30 parts by weight |
| 1-hydroxycyclohexyl phenyl ketone | 1 part by weight |
| silica fine particle (mean particle size: 50 nm, trade name: Chemisnow MP available from Soken Chemical & Engineering Co., Ltd.) | 5 parts by weight |

The above Formulation II was homogeneously dissolved to give a mixture, which was applied onto a whole surface of a release sheet (width: 300 mm, length: 1,000 m, thickness: 75 μm; trade name: No. 23, available from Fujimori Kogyo) and dried to form a photo-curable transfer layer of thickness of 20±2 μm. Subsequently, the release sheet that is same as above was applied to the opposite side of the photo-curable transfer layer to be rolled up in the form of roll. Thus, a full-edge type roll of photo-curable transfer sheet (diameter: 0.5 m) was prepared.

Comparison Example 4

Example 6 was repeated except for not using the silica fine particle of Formulation II to prepare a full-edge type roll of photo-curable transfer sheet.

Comparison Example 5

Example 6 was repeated except for using 5 weight parts of another silica fine particle (mean particle size: 1,000 nm, trade name: Chemisnow MP, available from Soken Chemical & Engineering Co., Ltd.) instead of the above silica fine particle of Formulation II to prepare a full-edge type roll of photo-curable transfer sheet.

(1) Evaluation of Photo-Curable Transfer Sheet
(1-1) Bleeding

The rolls obtained in Example 6 and Comparison Examples 4 and 5 are allowed to stand at ordinary temperature for 24 hours, and then bleeding in the sides of each of the rolls is observed. The appearance of the bleeding is evaluated as follows:

| ○: | Bleeding is not observed; |
| --- | --- |
| Δ: | Bleeding is slightly observed; |
| x: | Bleeding is significantly observed. |

(1-2) Creep Test of Transfer Sheet

The rolls obtained in Example 6 and Comparison Example 4 are allowed to stand at 25° C. for 24 hours, and then the transfer layers of the sheets of the rolls are subjected to a creep test using RheoStress RS300 (available from HAAKE) as a dynamic viscoelasticity measuring apparatus. The test is carried out using a parallel plate of φ=20 mm under the conditions of a thickness to be measured of 1 mm (obtained by superposing and forming the transfer layers), a measuring temperature of 25° C., a stress of 50 Pa and a stress application time of 120 seconds.

By using the obtained data, plot of strain [γ] (%) against time [t] (second) forms a graph showing the relationship between log γ and log t. The "b" of the formula "a log γ=a+ b·log t" in each of the Example 6 and Comparison Example 4 is obtained from the graph.

(2) Evaluation of Optical Information Recording Medium
<Preparation of Optical Information Recording Medium>

After the photo-curable transfer sheet was punched out in the form of disc, the resultant disc-shaped photo-curable transfer sheet was placed on an aluminum reflective layer (70 nm) formed on an uneven surface of a polycarbonate substrate (thickness: 1.1 mm) having the uneven surface as pits formed by injection molding such that the surface of the transfer sheet was in contact with the reflective layer, and depressed using a roller made of silicone rubber under load of 1 kg to form a laminate (corresponding to (3) of FIG. 2).

Subsequently, the other release sheet of the transfer sheet of the laminate was removed, and an uneven surface of a nickel stamper having the uneven surface as pits was placed on the exposed surface of the transfer sheet such that the uneven surface was in contact with the exposed surface, and the stamper was depressed using a roller made of silicone rubber. under load of 2 kg to form a laminate, whereby the uneven surface of the stamper was transferred to the exposed surface of the transfer sheet.

Subsequently, the photo-curable transfer sheet of the laminate was exposed to UV-rays under the condition of an integrated amount of light of 1,000 mJ/cm² using a metal halide lamp and as a result, the transfer sheet (transfer layer) was cured.

The stamper was peeled from the laminate. Silver alloy was spattered on the uneven surface of the cured photo-curable transfer sheet to form a semi-transparent reflective layer of silver alloy. A polycarbonate film (thickness: 70 μm; PureAce C110-70, available from Teijin Ltd.) was bonded onto the semi-transparent reflective layer through an adhesion.

Thus, an optical information recording medium having two layers provided with uneven surface was prepared.
<Evaluation of Optical Information Recording Medium>
(2-1) Light Transmittance (Wavelength of 380 to 420 nm)

Light transmittance of one photo-curable transfer sheet is measured in the wavelength of 380 to 420 nm according to JIS K 6717. Light transmittance of 70% or more is marked as ○, and Light transmittance of less than 70% is marked as x.
(2-2) Readout of Signals The information of the resultant optical information recording medium is read out using a laser beam of wavelength of 405 nm to obtain its wavy pattern. This wavy pattern is compared with that of the stamper. The wavy pattern of the medium coincident with that of the stamper is marked as ○, and the wavy pattern of the medium little coincident with that of the stamper is marked as x.

The obtained results are shown in Table 3.

TABLE 3

|  | Example 6 | Co. Ex. 4 | Co. Ex. 5 |
| --- | --- | --- | --- |
| Bleeding | ○ | x | ○ |
| b | 0.50 | 0.59 | — |
| Light transmittance (380-420 nm) | ○ | ○ | ○ |
| Readout of signals | ○ | ○ | x |

The photo-curable transfer sheet obtained in Example 6 shows a small b value and no bleeding of the roll, and the shape of pits of the optical information recording medium prepared using the sheet is good. Further the transfer sheet shows excellent transferring property and workability.

The photo-curable transfer sheets containing no silica fine particle obtained in Comparison Example 4 shows good shape of pits but shows a large b value and brings about occurrence of bleeding of the roll and therefore reduces workability. Further the photo-curable transfer sheet containing silica fine particle outside the mean particle size range of the invention (Comparison Example 5) shows no occurrence of bleeding of the roll but the shape of pits of the optical information recording medium prepared using the sheet is not good.

Hence, the photo-curable transfer sheets of the invention are enhanced in the workability without reduction of the characteristics of the optical information recording medium.

Example 7

<Preparation of Photo-Curable Transfer Sheet>
(Preparation of Reactive Polymer)

| Formulation I | |
| --- | --- |
| 2-ethylhexyl methacrylate | 70 parts by weight |
| methyl methacrylate | 20 parts by weight |
| 2-hydroxyethyl methacrylate | 10 parts by weight |
| benzophenone | 5 parts by weight |
| toluene | 30 parts by weight |
| ethyl acetate | 30 parts by weight |

A mixture of the above Formulation I was heated to 60° C. with moderately stirring to initiate the polymerization, and stirred at this temperature for 10 hours to provide acrylic resin having a hydroxyl group on its side chain. Then, 5 parts by weight of Calens MOI (2-isocyanatoethyl methacrylate; available from Showa Denko K.K.) was added to the solution of the acrylic resin, and reacted with each other in an atmosphere of nitrogen at 50° C. with moderately stirring to provide a solution 1 containing a reactive polymer having a photopolymerizable functional group.

The resultant reactive polymer has Tg of 0° C. and 5% by mole of methacryloyl group.

| Formulation II | |
| --- | --- |
| solution 1 of reactive polymer | 100 parts by weight |
| hexanediol diacrylate | 30 parts by weight |
| 1-hydroxycyclohexyl phenyl ketone | 1 part by weight |

The above Formulation II was homogeneously dissolved to give a mixture, which was applied onto a whole surface of a release sheet (width: 300 mm, length: 1,000 m, thickness: 75μm; trade name: No. 23, available from Fujimori Kogyo) and dried to form a photo-curable transfer layer of thickness of 20±2 μm. Subsequently, the release sheet that is same as above was applied to the opposite side of the photo-curable transfer layer to be rolled up in the form of roll. Thus, a full-edge type roll of photo-curable transfer sheet (diameter: 0.5 m) was prepared.

Comparison Example 6

Example 6 was repeated except for not using the hexanediol diacrylate of Formulation II to prepare a roll of photo-curable transfer sheet.

Comparison Example 7

Example 6 was repeated except for using the hexanediol diacrylate of Formulation II in the amount of 60 weight parts to prepare a type roll of photo-curable transfer sheet.

(1) Evaluation of Photo-Curable Transfer Sheet (1-1) Measurement of Storage Elastic Modulus of Transfer Sheet The storage elastic moduli of the transfer layers of the transfer sheets obtained in Example 7 and Comparison Examples 6 and 7 are measured using RheoStress RS300 (available from HAAKE) as a dynamic viscoelasticity measuring apparatus. The measurement is carried out using a parallel plate of $\phi$=20 mm under the conditions of a thickness to be measured of 1 mm (obtained by superposing and forming the transfer layers), a measuring temperature of 25° C., a stress of 50 Pa and frequency of 0.01 Hz, 1 Hz and 100 Hz.

(1-2) Accuracy of Thickness

The thickness of the obtained photo-curable transfer sheet is measured at 10 points per 1 m$^2$ of the sheet. Variation of the values of the thicknesses is determined.

| | |
|---|---|
| ○: | Variation of not more than 5%; |
| x: | Variation of more than 5%. |

(2) Evaluation of Optical Information Recording Medium

<Preparation of Optical Information Recording Medium>

After the photo-curable transfer sheet was punched out in the form of disc, the resultant disc-shaped photo-curable transfer sheet was placed on an aluminum reflective layer (70 nm) formed on an uneven surface of a polycarbonate substrate (thickness: 1.1 mm) having the uneven surface as pits formed by injection molding such that the surface of the transfer sheet was in contact with the reflective layer, and depressed using a roller made of silicone rubber having the surface temperature of 25° C. under load of 2 kg to form a laminate (corresponding to (3) of FIG. 2).

Subsequently, the other release sheet of the transfer sheet of the laminate was removed, and an uneven surface of a nickel stamper having the uneven surface as pits was placed on the exposed surface of the transfer sheet such that the uneven surface was in contact with the exposed surface, and the stamper was depressed using a roller made of silicone rubber having the surface temperature of 25° C. under load of 2 kg to form a laminate, whereby the uneven surface of the stamper was transferred to the exposed surface of the transfer sheet.

Subsequently, the photo-curable transfer sheet of the laminate was exposed to UV-rays under the condition of an integrated amount of light of 1,000 mJ/cm$^2$ using a metal halide lamp and as a result, the transfer sheet (transfer layer) was cured.

The stamper was peeled from the laminate. Silver alloy was spattered on the uneven surface of the cured photo-curable transfer sheet to form a semi-transparent reflective layer of silver alloy. A polycarbonate film (thickness: 70 μm; PureAce C110-70, available from Teijin Ltd.) was bonded onto the semi-transparent reflective layer through an adhesion.

Thus, an optical information recording medium having two layers provided with uneven surface was prepared.

<Evaluation of Optical Information Recording Medium>

(2-1) Light Transmittance (Wavelength of 380 to 420 nm)

Light transmittance of one photo-curable transfer sheet is measured in the wavelength of 380 to 420 nm according to JIS K 6717. Light transmittance of 70% or more is marked as ○, and Light transmittance of less than 70% is marked as x.

(2-2) Transferring Property of Optical Information Recording Medium (Readout of Signals)

The information of the resultant optical information recording medium is read out using a laser beam of wavelength of 405 nm to obtain its wavy pattern. This wavy pattern is compared with that of the stamper. The wavy pattern of the medium coincident with that of the stamper is marked as ○, and the wavy pattern of the medium little coincident with that of the stamper is marked as x.

The obtained results are shown in Table 4.

TABLE 4

| | Example 7 | Co. Ex. 6 | Co. Ex. 7 |
|---|---|---|---|
| Storage elastic modulus (0.01 Hz) | 1 × 10$^4$ Pa | 1 × 10$^5$ Pa | 3 × 10$^3$ Pa |
| Storage elastic modulus (1 Hz) | 5 × 10$^4$ Pa | 5 × 10$^5$ Pa | 1 × 10$^4$ Pa |
| Storage elastic modulus (100 Hz) | 4 × 10$^6$ Pa | 1 × 10$^8$ Pa | 1 × 10$^6$ Pa |
| Accuracy of thickness | ○ | ○ | x |
| Light transmittance (380-420 nm) | ○ | ○ | ○ |
| Transferring property | ○ | x | ○ |

The photo-curable transfer sheet obtained in Example 7 shows excellent accuracy of thickness and workability, and the shape of pits of the optical information recording medium prepared using the sheet is good. Further the transferring property at ordinary temperature is excellent.

The optical information recording medium prepared from the photo-curable transfer sheets using no reactive diluent and having storage elastic moduli higher than those of the invention obtained in Comparison Example 6 shows excellent accuracy of thickness but reduces transferring property. The optical information recording medium prepared from the photo-curable transfer sheets having storage elastic moduli lower than those of the invention obtained in Comparison Example 7 shows excellent transferring property but reduces accuracy of thickness.

Examples 8 to 16

<Preparation of Photo-Curable Transfer Sheet>

(Preparation of Reactive Polymer)

| Formulation I | |
|---|---|
| 2-ethylhexyl methacrylate | 70 parts by weight |
| methyl methacrylate | 20 parts by weight |
| 2-hydroxyethyl methacrylate | 10 parts by weight |
| benzophenone | 5 parts by weight |
| toluene | 30 parts by weight |
| ethyl acetate | 30 parts by weight |

A mixture of the above Formulation I was heated to 60° C. with moderately stirring to initiate the polymerization, and stirred at this temperature for 10 hours to provide acrylic resin having a hydroxyl group on its side chain. Then, 5 parts by weight of Calens MOI (2-isocyanatoethyl methacrylate; available from Showa Denko K.K.) was added to the solution of the acrylic resin, and reacted with each other in an atmosphere of nitrogen at 50° C. with moderately stirring to provide a solution 1 containing a reactive polymer having a photopolymerizable functional group.

The resultant reactive polymer has Tg of 0° C. and 5% by mole of methacryloyl group.

| Formulation II | |
| --- | --- |
| solution 1 of reactive polymer (solid content: 63.6% by weight) | 100 parts by weight |
| acrylic resin (Tg: 65° C., number average molecular weight: 230,000, trade name: Dianal BR-90, available from Mitsubishi Rayon) | 10 parts by weight |
| hexanediol diacrylate | 40 parts by weight |
| phenol compound having substituent (shown in Table 5) | 0.05 part by weight |
| 1-hydroxycyclohexyl phenyl ketone (Irgercure 184, available from Chiba-Geigy) | 1 part by weight |

The above Formulation II was homogeneously dissolved to give a mixture, which was applied onto a whole surface of a release sheet (width: 300 mm, length: 1,000 m, thickness: 75 µm; trade name: No. 23, available from Fujimori Kogyo) and dried to form a photo-curable transfer layer of thickness of 20±2 µm. Subsequently, the release sheet that is same as above was applied to the opposite side of the photo-curable transfer layer to be rolled up in the form of roll. Thus, a roll of photo-curable transfer sheet (diameter: 0.5 m) was prepared.

Comparison Example 8

Example 8 was repeated except for not using the phenol compound having substituent of Formulation II to prepare a roll of photo-curable transfer sheet.
[Evaluation of Optical Information Recording Medium]
<Preparation of Optical Information Recording Medium>

After the photo-curable transfer sheet was punched out in the form of disc, the resultant disc-shaped photo-curable transfer sheet was placed on a semi-transparent reflective layer (70 nm) of silver alloy (APC) formed on an uneven surface of a polycarbonate substrate (thickness: 1.1 mm) having the uneven surface as pits formed by injection molding such that the surface of the transfer sheet was in contact with the reflective layer, and depressed using a roller made of silicone rubber having the surface temperature of 25° C. under load of 2 kg to form a laminate (corresponding to (3) of FIG. 2).

Subsequently, the other release sheet of the transfer sheet of the laminate was removed, and an uneven surface of a nickel stamper having the uneven surface as pits was placed on the exposed surface of the transfer sheet such that the uneven surface was in contact with the exposed surface, and the stamper was depressed using a roller made of silicone rubber having the surface temperature of 25° C. under load of 2 kg to form a laminate, whereby the uneven surface of the stamper was transferred to the exposed surface of the transfer sheet.

Subsequently, the photo-curable transfer sheet of the laminate was exposed to UV-rays under the condition of an integrated amount of light of 1,000 mJ/cm² using a metal halide lamp and as a result, the transfer sheet (transfer layer) was cured.

The stamper was peeled from the laminate. Aluminum was spattered on the uneven surface of the cured photo-curable transfer sheet to form an aluminum reflective layer (70 nm). A polycarbonate film (thickness: 70 µm; Pure Ace C110-70, available from Teijin Ltd.) was bonded onto the aluminum reflective layer through an adhesion.

Thus, an optical information recording medium having two layers provided with uneven surface was prepared.

<Evaluation of Optical Information Recording Medium>
(1) Light Transmittance of the Recording Medium (Wavelength of 380 to 420 nm)

The photo-curable transfer sheet is cured in the same conditions as above, and then light transmittance of the photo-curable transfer sheet is measured in the wavelength of 380 to 420 nm according to JIS R 3257. Light transmittance of 90% or more is marked as ○, and Light transmittance of less than 90% is marked as x.

(2) Changed Amount of Reflectivity of the Recording Medium

The reflectivity of the reflective layer (AgX) of the resultant optical 5 information recording medium is measured from the side of the substrate, and then the recording medium is allowed to stand in a thermostat bath of a temperature 80° C. and humidity 85% for 24 hours (accelerating test) to measure the reflectivity in the same manner as above. The difference between the reflectivity of the initial medium and that of the medium subjected to the accelerating test is shown in Table 5. The reflectivities of all the initial media are 43%.

The obtained results are shown in Table 5.

TABLE 5

| | Phenol compound | Amount of reflectivity change (%) | Transmittance |
| --- | --- | --- | --- |
| Example 8 | 4-methoxyphenol | 3 | ○ |
| Example 9 | Adeka Stab AO-20 | 3 | ○ |
| Example 10 | Adeka Stab AO-30 | 3 | ○ |
| Example 11 | Adeka Stab AO-40 | 3 | ○ |
| Example 12 | Adeka Stab AO-50 | 3 | ○ |
| Example 13 | Adeka Stab AO-60 | 3 | ○ |
| Example 14 | Adeka Stab AO-70 | 3 | ○ |
| Example 15 | Adeka Stab AO-80 | 3 | ○ |
| Example 16 | Adeka Stab AO-330 | 3 | ○ |
| Co. Ex. 8 | None | 7 | ○ |

In Table 5, Adeka Stab is trade name of Asahi Denka Co., Ltd.

The optical information recording media obtained in Examples 8-16 show only a small reduction of the reflectivity even after exposed to an atmosphere of high temperature and humidity. In contrast, the optical information recording medium containing no phenol compound obtained in Comparison Example 8 shows a large reduction of the reflectivity.

Example 17

<Preparation of Photo-Curable Transfer Sheet>
(Preparation of Reactive Polymer)

| Formulation I | |
| --- | --- |
| 2-ethylhexyl methacrylate | 70 parts by weight |
| methyl methacrylate | 20 parts by weight |
| 2-hydroxyethyl methacrylate | 10 parts by weight |
| benzophenone | 5 parts by weight |
| toluene | 30 parts by weight |
| ethyl acetate | 30 parts by weight |

A mixture of the above Formulation I was heated to 60° C. with moderately stirring to initiate the polymerization, and stirred at this temperature for 10 hours to provide acrylic resin having a hydroxyl group on its side chain. Then, 5 parts by weight of Calens MOI (2-isocyanatoethyl methacrylate; available from Showa Denko K.K.) was added to the solution of the acrylic resin, and reacted with each other in an atmosphere of nitrogen at 50° C. with moderately stirring to provide a solution 1 containing a reactive polymer having a photopolymerizable functional group.

The resultant reactive polymer has Tg of 0° C. and 5% by mole of methacryloyl group.

| Formulation II | |
|---|---|
| solution 1 of reactive polymer (solid content: 63.6% by weight) | 100 parts by weight |
| acrylic resin (Tg: 65° C., number average molecular weight: 230,000, trade name: Dianal BR-90, available from Mitsubishi Rayon) | 10 parts by weight |
| neopentylglycol diacrylate (LIGHT-ACRYLATE NP-A, available from KYOEISHA CHEMICAL Co., Ltd.) | 40 parts by weight |
| 1-hydroxycyclohexyl phenyl ketone (Irgercure 184, available from Chiba-Geigy) | 1 part by weight |

The above Formulation II was homogeneously dissolved to give a mixture, which was applied onto a whole surface of a release sheet (width: 300 mm, length: 1,000 m, thickness: 75 µm; trade name: No. 23, available from Fujimori Kogyo) and dried to form a photo-curable transfer layer of thickness of 20±2 µm. Subsequently, the release sheet that is same as above was applied to the opposite side of the photo-curable transfer layer to be rolled up in the form of roll. Thus, a roll of photo-curable transfer sheet (diameter: 0.5 m) was prepared.

Example 18

Example 17 was repeated except for using dimethylolcyclodecane diacrylate (KAYARAD R-684, available from NIPPON KAYAKU) instead of neopentylglycol diacrylate of Formulation II to prepare a roll of photo-curable transfer sheet.

Comparison Examples 9-12

Example 17 was repeated except for not using a compound shown in Table 6 instead of neopentylglycol diacrylate of Formulation II to prepare a roll of photo-curable transfer sheet.
[Evaluation of Optical Information Recording Medium]
<Preparation of Optical Information Recording Medium>

After the photo-curable transfer sheet was punched out in the form of disc, the resultant disc-shaped photo-curable transfer sheet was placed on a semi-transparent reflective layer (70 nm) of silver alloy (APC) formed on an uneven surface of a polycarbonate substrate (thickness: 1.1 mm) having the uneven surface as pits formed by injection molding such that the surface of the transfer sheet was in contact with the reflective layer, and depressed using a roller made of silicone rubber having the surface temperature of 25° C. under load of 2 kg to form a laminate (corresponding to (3) of FIG. 2).

Subsequently, the other release sheet of the transfer sheet of the laminate was removed, and an uneven surface of a nickel stamper having the uneven surface as pits was placed on the exposed surface of the transfer sheet such that the uneven surface was in contact with the exposed surface, and the stamper was depressed using a roller made of silicone rubber having the surface temperature of 25° C. under load of 2 kg to form a laminate, whereby the uneven surface of the stamper was transferred to the exposed surface of the transfer sheet.

Subsequently, the photo-curable transfer sheet of the laminate was exposed to UV-rays under the condition of an integrated amount of light of 1,000 mJ/cm$^2$ using a metal halide lamp and as a result, the transfer sheet (transfer layer) was cured.

The stamper was peeled from the laminate. Silver alloy was spattered on the uneven surface of the cured photo-curable transfer sheet to form a silver alloy reflective layer (70 nm). A polycarbonate film (thickness: 70 µm; Pure Ace C110-70, available from Teijin Ltd.) was bonded onto the aluminum reflective layer through an adhesion.

Thus, an optical information recording medium having two layers provided with uneven surface was prepared.
<Evaluation of Optical Information Recording Medium>
(1) Light Transmittance of the Recording Medium (Wavelength of 380 to 420 nm)

The photo-curable transfer sheet is cured in the same conditions as above, and then light transmittance of the photo-curable transfer sheet is measured in the wavelength of 380 to 420 nm according to JIS R 3257. Light transmittance of 90% or more is marked as ○, and Light transmittance of less than 90% is marked as x.
(2) Water Contact Angle of the Cured Layer of the Recording Medium The photo-curable transfer sheet is cured in the same conditions as above before the contact with the stamper, and then water contact angle of the cured layer is measured by a contact angle measuring equipment (CA-X, available from Kyowa Interface Science Co., Ltd. according to JIS R 3257.
(3) Changed Amount of Reflectivity of the Recording Medium The reflectivity of the reflective layer (AgX) the resultant optical information recording medium is measured from the side of the substrate, and then the recording medium is allowed to stand in a thermostat bath of a temperature 80° C. and humidity 85% for 24 hours (accelerating test) to measure the reflectivity in the same manner as above. The difference between the reflectivity of the initial medium and that of the medium subjected to the accelerating test is shown in Table 6. The reflectivities of all the initial media are 43%. As the changed amount of the reflectivity, the change of 3% or less is marked as ○, and more than 3% is marked as x.

The obtained results are shown in Table 6.

TABLE 6

| | Reactive diluent | Contact angle | Amount of reflectivity change (%) (Judgment) | Transmittance |
|---|---|---|---|---|
| Example 17 | NPGDA | 61° | 1.9 (○) | ○ |
| Example 18 | R684 | 65° | 2.2 (○) | ○ |
| Co. Ex. 9 | A-400 | 47° | 12.5 (x) | ○ |
| Co. Ex. 10 | A-TMPT | 57° | 6.7 (x) | ○ |
| Co. Ex. 11 | KS-HDDA | 59° | 5.0 (x) | ○ |
| Co. Ex. 12 | R-712 | 58° | 6.3 (x) | ○ |

In Table 6,
A-400: polyethyleneglycol diacrylate ((PEG400) diacrylate);
A-TMPT: trimethylolpropane triacrylate;
KS-HDDA: 1,6-hexanediol diacrylate;
R-712: trade name KAYARAD R-712, available from NIPPON KAYAKU.

The optical information recording media having high water contact angle obtained in Examples 17 & 18 show only a small reduction of the reflectivity even after exposed to an atmosphere of high temperature and humidity. In contrast, the optical information recording media having low water contact angle obtained in Comparison Examples 9 to 12 show a large reduction of the reflectivity. Thus the optical information recording medium of the invention has excellent durability.

Examples 19-21 and Comparison Examples 13-16

<Preparation of Photo-Curable Transfer Sheet>
(Preparation of Reactive Polymer)

| Formulation I | |
|---|---|
| 2-ethylhexyl methacrylate | 70 parts by weight |
| methyl methacrylate | 20 parts by weight |
| 2-hydroxyethyl methacrylate | 10 parts by weight |
| benzophenone | 5 parts by weight |
| toluene | 30 parts by weight |
| ethyl acetate | 30 parts by weight |

A mixture of the above Formulation I was heated to 60° C. with moderately stirring to initiate the polymerization, and stirred at this temperature for 10 hours to provide acrylic resin having a hydroxyl group on its side chain. Then, 5 parts by weight of Calens MOI (2-isocyanatoethyl methacrylate; available from Showa Denko K.K.) was added to the solution of the acrylic resin, and reacted with each other in an atmosphere of nitrogen at 50° C. with moderately stirring to provide a solution 1 containing a reactive polymer having a photopolymerizable functional group.

The resultant reactive polymer has Tg of 0° C. and 5% by mole of methacryloyl group.

| Formulation II | |
|---|---|
| solution 1 of reactive polymer (solid content: 63.6% by weight) | 100 parts by weight |
| acrylic resin (Tg: 65° C., number average molecular weight: 230,000, trade name: Dianal BR-90, available from Mitsubishi Rayon) | 10 parts by weight |
| reactive diluent (hexanediol diacrylate) | 40 parts by weight |
| phosphoric methacrylate (ethyleneoxide modified phosphoric dimethacrylate, available from NIPPON KAYAKU) | part by weight shown in Table 7 |
| photopolymerization initiator (1-hydroxycyclohexyl phenyl ketone, Irgercure 184, available from Chiba-Geigy) | 1 part by weight |

The above Formulation II was homogeneously dissolved to give a mixture, which was applied onto a whole surface of a release sheet (width: 300 mm, length: 1,000 m, thickness: 75 μm; trade name: No. 23, available from Fujimori Kogyo) and dried to form a photo-curable transfer layer of thickness of 20±2 μm. Subsequently, the release sheet that is same as above was applied to the opposite side of the photo-curable transfer layer to be rolled up in the form of roll. Thus, a roll of photo-curable transfer sheet (diameter: 0.5 m) was prepared.
[Evaluation of Optical Information Recording Medium]
<Preparation of Optical Information Recording Medium>

After the photo-curable transfer sheet was punched out in the form of disc, the resultant disc-shaped photo-curable transfer sheet was placed on a semi-transparent reflective layer (70 nm) of silver alloy (APC) formed on an uneven surface of a polycarbonate substrate (thickness: 1.1 mm) having the uneven surface as pits formed by injection molding such that the surface of the transfer sheet was in contact with the reflective layer, and depressed using a roller made of silicone rubber having the surface temperature of 25° C. under load of 2 kg to form a laminate (corresponding to (3) of FIG. 2).

Subsequently, the other release sheet of the transfer sheet of the laminate was removed, and an uneven surface of a nickel stamper having the uneven surface as pits was placed on the exposed surface of the transfer sheet such that the uneven surface was in contact with the exposed surface, and the stamper was depressed using a roller made of silicone rubber having the surface temperature of 25° C. under load of 2 kg to form a laminate, whereby the uneven surface of the stamper was transferred to the exposed surface of the transfer sheet.

Subsequently, the photo-curable transfer sheet of the laminate was exposed to UV-rays under the condition of an integrated amount of light of 1,000 mJ/cm² using a metal halide lamp and as a result, the transfer sheet (transfer layer) was cured.

The stamper was peeled from the laminate. Aluminum was spattered on the uneven surface of the cured photo-curable transfer sheet to form an aluminum reflective layer (70 nm). A polycarbonate film (thickness: 70 μm; Pure Ace C 110-70, available from Teijin Ltd.) was bonded onto the aluminum reflective layer through an adhesion.

Thus, an optical information recording medium having two layers provided with uneven surface was prepared.
<Evaluation of Optical Information Recording Medium>
(1) Peeling Property of Stamper When the stamper is removed (peeled) from the laminate after the above UV exposure, it is evaluated whether the removing operation is carried out well or not as follows:
  ○: the cured transfer layer is completely left on the laminate;
  x: the cured transfer layer is not completely left on the laminate with a part of the transfer layer adhering to the stamper.
(2) Changed Amount of Reflectivity of the Recording Medium The reflectivity of the reflective layer (Ag alloy: APC) the resultant optical information recording medium is measured from the side of the substrate using a laser beam of 405 nm, and then the recording medium is allowed to stand in a thermostat bath of a temperature 80° C. and humidity 85% for 240 hours (accelerating test) to measure the reflectivity in the same manner as above. The difference between the reflectivity of the initial medium and that of the medium subjected to the accelerating test is shown in Table 7. The reflectivities of all the initial media are 43%.

The obtained results are shown in Table 7.

TABLE 7

| | Phosphoric methacrylate (added part by weight) | Amount of reflectivity change (%) (Judgment) | Peeling property |
|---|---|---|---|
| Co. Ex. 13 | — | 3 | x |
| Co. Ex. 14 | 0.001 | 3 | x |
| Example 19 | 0.003 | 3 | ○ |
| Example 20 | 0.01 | 3 | ○ |
| Example 21 | 0.03 | 3 | ○ |
| Co. Ex. 15 | 0.05 | 5 | ○ |
| Co. Ex. 16 | 0.1 | 10 | x |

The optical information recording media obtained in Examples 19 to 21 show good peeling property of stamper during the preparation of the recording medium, and a small reduction of the reflectivity even after exposed to an atmosphere of high temperature and humidity, and therefore the optical information recording medium of the invention displays excellent durability. In contrast, the optical information recording media obtained in Comparison Examples 13 & 14 show a small reduction of the reflectivity, but poor peeling property of stamper during the preparation of the recording medium. Moreover, the optical information recording media obtained in Comparison Examples 15 & 16 show a large reduction of the reflectivity and hence has insufficient durability.

INDUSTRIAL APPLICABILITY

The photo-curable transfer sheet of the invention is useful for preparing an optical information recording medium (e.g., DVD) having small thickness and high capacity, and the transfer sheet does not bleed the components of the transfer layer on its side and does not generate variation of the thickness of the transfer sheet (transfer layer), when the sheet is used in the form of continuous length and roll that is advantageous to the preparation. Therefore the transfer sheet has excellent workability.

In more detail, particularly the use of the specified layer described in the photo-curable transfer sheet (1) to (5) [e.g., layers having the specific creep characteristics, the specific tackifier and the specific fine particle] as the photo-curable transfer layer containing the reactive polymer having polymerizable functional group advantageous to transfer operation at an ordinary temperature, enables repression of bleeding of the components of the transfer layer during the preparation, processing or storage, and repression of occurrence of variation of the thickness of the sheet during the storage. The variation is liable to occur when the transferring property is improved.

Further, in the optical information recording medium obtained by the use of the photo-curable transfer sheet (6) to (8), the use of the cured transfer layer of the above sheet as a layer in contact with the reflective layer of silver or silver alloy enables repression of reduction of the reflectivity (especially because of occurrence of diffused reflection in the interface between the silver reflective layer and the cured layer), or repression of corrosion of the reflective layer generated over a long term.

Hence, even the long term use of the above optical disc does not bring about reduction of the reflectivity, and therefore the disc can be reproduced without occurrence of error over a long term. Especially, the use of the sheet (6) represses deterioration of the transfer layer owing to yellowing, and the use of the sheet (7) represses invasion of water to the transfer layer even in an atmosphere of high temperature and humidity because the transfer layer is a cured layer of a photo-curable composition having extremely hydrophobic property of water contact angle of not less than 60 degrees. Thus the transfer sheets bring about the effects described above.

Further in the use of the sheet (8), the cured transfer layer is strongly bonded to a thin film made of silver alloy and the like, which represses the peeling during the preparation, and therefore in addition to the above effects, the preparation is made further easy to enhance workability. Further after the preparation, since the excellent adhesion of the cured film to the thin film of silver alloy is maintained, reduction of the reflectivity (considered to be caused by corrosion of the thin film) is also not found. Particularly, the layer of the photo-curable composition of the sheet (8) is improved in adhesion to the silver alloy compared with adhesion to Ni constituting to the stamper, and therefore the cured layer is successfully and selectively left onto the silver alloy without leaving on the stamper when the stamper is removed from the cured layer.

Hence, in case the optical disc is prepared by superposing multi layers, the transfer sheet (8) of the invention can be advantageously used.

Further, the photo reactive polymer is used in the invention and therefore the cured layer is strongly bonded to the reflective layer and has high film strength, to display high protective action to the reflective layer.

The invention claimed is:

1. A photo-curable transfer sheet having a photo-curable transfer layer comprising a photo-curable composition, the photo-curable composition being deformable by application of pressure and containing a reactive polymer having a photopolymerizable functional group,
wherein the photo-curable transfer layer shows linearity in relationship between strain [γ] (%) and time [t] (second) determined by a creep test using a dynamic viscoelasticity measuring apparatus under the conditions of an ordinary temperature, stress of 50 Pa and a time period of 120 seconds, and satisfies a following formula:

$$\log \gamma = a + b \cdot \log t$$

in which "a" is a real number, and "b" is in the range of 0.10 to 0.53.

2. The photo-curable transfer sheet as defined in claim 1, wherein the reactive polymer has a glass transition temperature of not more than 20° C.

3. The photo-curable transfer sheet as defined in claim 1 or 2, wherein the reactive polymer has number average molecular weight of 10,000 to 300,000.

4. The photo-curable transfer sheet as defined in claim 1, wherein the reactive polymer has weight average molecular weight of 10,000 to 300,000.

5. The photo-curable transfer sheet as defined in claim 1, wherein the reactive polymer has 1 to 50% by mole of the photopolymerizable functional group.

6. The photo-curable transfer sheet as defined in claim 1, wherein the photopolymerizable functional group is a (meth) acryloyl group.

7. The photo-curable transfer sheet as defined in claim 1, wherein the reactive polymer has a functional group having active hydrogen and the photopolymerizable functional group, and the photo-curable composition contains a compound having at least two groups reactive to the functional group having active hydrogen.

8. The photo-curable transfer sheet as defined in claim 7, wherein the functional group having active hydrogen is a hydroxyl group.

9. The photo-curable transfer sheet as defined in claim 7 or 8, wherein the groups reactive to the functional group having active hydrogen are isocyanate groups.

10. The photo-curable transfer sheet as defined in claim 1, wherein the photo-curable composition further contains a tackifier having solubility parameter (SP value) of not less than 8.50.

11. The photo-curable transfer sheet as defined in claim 1, wherein the photo-curable composition further contains a transparent fine particle having mean particle size of not more than 300 nm.

12. The photo-curable transfer sheet as defined in claim 1, wherein the photo-curable transfer layer has storage elastic moduli of $1 \times 10^3$ to $9 \times 10^4$ Pa at frequency of 1 Hz and a temperature of 25° C., of not less than $5 \times 10^3$ Pa at a frequency of 0.01 Hz and a temperature of 25° C., and of not more than $1 \times 10^7$ Pa at frequency of 100 Hz and a temperature of 25° C.

13. The photo-curable transfer sheet as defined in claim 1, wherein the photo-curable composition further contains a phenol compound having a substituent or substituents in the amount of 0.01 to 0.3% by weight.

14. The photo-curable transfer sheet as defined in claim 1, wherein a surface of a cured layer formed by curing the photo-curable composition has a water contact angle of not less than 60 degrees.

15. The photo-curable transfer sheet as defined in claim 1, wherein the photo-curable composition contains phosphoric acid (meth)acrylate or derivatives thereof in the amount of 10 to 220 ppm.

16. The photo-curable transfer sheet as defined in any of claims 1, wherein a release sheet is provided on one side or both sides of the photo-curable transfer layer.

17. The photo-curable transfer sheet as defined in claim 16, which is in the form of continuous length, and has the same width as the release sheet.

18. A process for the preparation of an optical information recording medium comprising of the steps (2) to (4):
- a step (2) of removing the release sheet on one side of the photo-curable transfer sheet as defined in claim 16,
- a step (3) of placing the photo-curable transfer sheet on an uneven surface of a reflective layer, such that the photo-curable transfer layer is in contact with the uneven surface, the reflective layer being formed on an uneven surface of a substrate having the uneven surface of recorded pits and/or grooves, and depressing the photo-curable transfer sheet and the substrate to form a laminate in which the one side of the photo-curable transfer sheet adheres closely to the uneven surface of the reflective layer, and
- a step (4) of removing the release sheet on the other side of the photo-curable transfer layer of the laminate.

19. The process for the preparation of an optical information recording medium as defined in claim 18,
wherein prior to the step (2), the following step (1) is performed:
- a step (1) of punching out a disc from the photo-curable transfer sheet, or
- a step (1) of punching out a disc comprising the photo-curable transfer layer and the release sheet on one side of the photo-curable transfer sheet from the photo-curable transfer sheet without punching out the other side release sheet.

20. The process for the preparation of an optical information recording medium as defined in claim 18,
wherein after the step (4), the following steps (5) and (6) are performed:
- a step (5) of placing an uneven surface of a stamper having the uneven surface of recorded pits and/or grooves on the surface having no release sheet of the laminate, and depressing the photo-curable transfer sheet and the stamper to form a laminate in which the surface of the photo-curable transfer layer adheres closely to the uneven surface of the stamper, and
- a step (6) of exposing the laminate having the stamper to ultraviolet rays to cure the photo-curable transfer layer, and removing the stamper from the laminate to form an uneven surface on the photo-curable transfer layer.

21. The process for the preparation of an optical information recording medium as defined in claim 20,
wherein after steps (5) and (6), the following step (7) is performed:
- a step (7) of forming a reflective layer on the uneven surface of the photo-curable transfer layer.

* * * * *